(12) United States Patent
Uejima

(10) Patent No.: US 8,805,299 B2
(45) Date of Patent: Aug. 12, 2014

(54) HIGH-FREQUENCY MODULE

(75) Inventor: Takanori Uejima, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 609 days.

(21) Appl. No.: 13/209,467

(22) Filed: Aug. 15, 2011

(65) Prior Publication Data

US 2012/0208591 A1 Aug. 16, 2012

(30) Foreign Application Priority Data

Aug. 16, 2010 (JP) ................. 2010-181489

(51) Int. Cl.
*H04B 1/44* (2006.01)
*H03H 9/72* (2006.01)
*H03H 7/46* (2006.01)
*H04B 1/00* (2006.01)

(52) U.S. Cl.
CPC ............. *H03H 9/725* (2013.01); *H04B 1/006* (2013.01); *H03H 7/463* (2013.01)
USPC .......... 455/78; 455/83; 455/552.1; 455/553.1

(58) Field of Classification Search
CPC ........ H04B 1/006; H04B 1/406; H04B 1/525; H03F 1/0277; H03F 1/223; H03H 7/463; H03H 9/725
USPC ........ 455/78, 82, 83, 84, 550.1, 552.1, 553.1, 455/562.1, 575.1; 370/342, 343
See application file for complete search history.

(56) References Cited

U.S. PATENT DOCUMENTS

| | | | |
|---|---|---|---|
| 6,380,823 B1 | 4/2002 | Ikata et al. | |
| 7,324,493 B2* | 1/2008 | Yamada et al. | 455/78 |
| 2004/0095919 A1* | 5/2004 | Nitani et al. | 370/343 |
| 2004/0266378 A1 | 12/2004 | Fukamachi et al. | |
| 2005/0079847 A1* | 4/2005 | Arafa | 455/562.1 |
| 2006/0030355 A1* | 2/2006 | Kemmochi et al. | 455/552.1 |
| 2008/0191812 A1 | 8/2008 | Uejima et al. | |
| 2013/0244722 A1* | 9/2013 | Rousu et al. | 455/552.1 |

FOREIGN PATENT DOCUMENTS

| | | |
|---|---|---|
| CN | 1309178 A | 8/2001 |
| CN | 101375515 A | 2/2009 |
| JP | 10-290176 A | 10/1998 |
| JP | 2000-349586 A | 12/2000 |
| JP | 2001-185902 A | 7/2001 |
| JP | 2002-290269 A | 10/2002 |
| JP | 2003-152588 A | 5/2003 |
| JP | 2005-064778 A | 3/2005 |

OTHER PUBLICATIONS

Official Communication issued in corresponding Japanese Patent Application No. 2010-181489, mailed on Oct. 2, 2012.

* cited by examiner

*Primary Examiner* — Thanh Le
(74) *Attorney, Agent, or Firm* — Keating & Bennett, LLP

(57) ABSTRACT

In a high-frequency module, a first individual terminal in a switch IC is connected to a first filter and a third filter whose pass bands are far from each other. A low-pass-filter phase circuit including an inductor and a capacitor is connected between the first individual terminal and the first filter. A second individual terminal is connected to a second filter and a fourth filter whose pass bands are far from each other. A low-pass-filter phase circuit is connected between the second individual terminal and the second filter.

8 Claims, 15 Drawing Sheets

HIGH-FREQUENCY MODULE

BACKGROUND OF THE INVENTION

1. Field of the Invention

The present invention relates to a high-frequency module that transmits and receives multiple communication signals via a common antenna.

2. Description of the Related Art

Various high-frequency modules that transmit and receive multiple communication signals using different frequency bands with common antennas have been proposed. For example, a high-frequency module disclosed in Japanese Unexamined Patent Application Publication No. 2005-64778 includes a switch integrated circuit (IC) and multiple duplexers. An antenna is connected to a common terminal in the switch IC and the respective duplexers are connected to individual terminals in the switch IC.

The high-frequency module disclosed in Japanese Unexamined Patent Application Publication No. 2005-64778 has, for example, a circuit configuration shown in FIG. 1. FIG. 1 is a diagram showing the circuit configuration of a high-frequency module 10P. Only a reception system circuit will be simply described here. Referring to FIG. 1, a switch IC 11 includes a common terminal PIC0 and individual terminals PIC11 to PIC16.

In reception of a Global System for Mobile Communication 850 (GSM850) communication signal and a GSM900 communication signal, the switch IC 11 connects the common terminal PIC0 to the individual terminal PIC13. In this case, the GSM850 communication signal and the GSM900 communication signal received via an antenna ANT are transmitted to the individual terminal PIC13.

A surface acoustic wave (SAW) duplexer SDP12 including SAW filters SAW1 and SAW2 is connected to the individual terminal PIC13. A phase circuit including a serially connected inductor L11 and a capacitor C11 grounding one end of the inductor L11 is connected between the individual terminal PIC13 and the SAW filter SAW1. A phase circuit including a serially connected capacitor C21 and an inductor L21 grounding one end of the capacitor C21 is connected between the individual terminal PIC13 and the SAW filter SAW2. In these phase circuits, the element values are determined so that the SAW filter SAW2 side is open (the reflection coefficient is maximized) for the GSM850 communication signal and the SAW filter SAW1 side is open (the reflection coefficient is maximized) for the GSM900 communication signal. The element values are determined in the above manner to ensure a certain level or higher of isolation between the SAW filters SAW1 and SAW2.

Similarly, when receiving a GSM1800 communication signal and a GSM1900 communication signal, the switch IC 11 connects the common terminal PIC0 to the individual terminal PIC14. In this case, the GSM1800 communication signal and the GSM1900 communication signal received via the antenna ANT are transmitted to the individual terminal PIC14.

A SAW duplexer SDP34 including SAW filters SAW3 and SAW4 is connected to the individual terminal PIC14. A phase circuit including a serially connected inductor L31 and a capacitor C31 grounding one end of the inductor L31 is connected between the individual terminal PIC14 and the SAW filter SAW3. A phase circuit including a serially connected capacitor C41 and an inductor L41 grounding one end of the capacitor C41 is connected between the individual terminal PIC14 and the SAW filter SAW4. In these phase circuits, the element values are determined so that the SAW filter SAW4 side is open (the reflection coefficient is maximized) for the GSM1800 communication signal and the SAW filter SAW3 side is open (the reflection coefficient is maximized) for the GSM1900 communication signal. The element values are determined in the above manner to ensure a certain level or higher of isolation between the SAW filters SAW3 and SAW4.

However, in the high-frequency module 10P described above, the pass bands of the SAW filters composing the SAW duplexer connected to one individual terminal in the switch IC 11 are close to each other. In other words, the frequency bands of the communication signals passing through the respective SAW filters are close to each other.

Accordingly, there are cases where it is not possible to set the frequency bands so as to achieve transmission characteristics having sufficiently low loss for the frequency band of one communication signal, among the two communication signals output from each individual terminal, and reflection characteristics sufficient for the frequency band of the remaining communication signal.

SUMMARY OF THE INVENTION

Accordingly, preferred embodiments of the present invention provide a high-frequency module that has a configuration in which multiple communication signals are switched and received via a common antenna and that is capable of transmitting two communication signals, among the multiple communication signals, to different ports with low loss even if the frequencies of the two communication signals are close to each other.

According to a preferred embodiment of the present invention, a high-frequency module includes a switch IC including a common terminal and a plurality of individual terminals; and a plurality of filters connected to the individual terminals in the switch IC, for which a pass band is set for each communication signal. The plurality of filters at least include a first filter having a frequency of a first communication signal as the pass band, a second filter having a frequency of a second communication signal as the pass band, the frequency band of the first communication signal being close to the frequency band of the second communication signal, and a third filter having a frequency of a third communication signal as the pass band, the frequency of the third communication signal being far from the frequencies of the first communication signal and the second communication signal. The first filter and the third filter are connected to a first individual terminal in the switch IC. The second filter is connected to a second individual terminal in the switch IC.

With the above configuration, the first communication signal and the second communication signal whose frequencies are close to each other are transmitted through different individual terminals in the switch IC. The first communication signal and the third communication signal whose frequencies are far from each other are transmitted through the same individual terminal in the switch IC. Accordingly, since the frequencies of the two communication signals transmitted through the same individual terminal are far from each other and the communication signals whose frequencies are close to each other are transmitted through different individual terminals even in the configuration in which multiple communication signals are transmitted through one individual terminal, it is possible to easily realize the configuration capable of ensuring high isolation. In addition, the high-frequency module can be reduced in size, compared with the configuration in which different individual terminals are provided for different communication signals.

In the high-frequency module, when a plurality of communication signals corresponding to the third communication signal exist, a communication signal whose phase variation within the frequency band is small and which has larger reflection strength for the first filter is preferably set to the third communication signal.

The above configuration indicates a criterion for setting the third communication signal when multiple communication signals whose frequencies are far from the frequencies of the first communication signal and the second communication signal exist. The third communication signal can be set in the above manner to reliably and easily ensure high isolation between the transmission path of the first communication signal including the first filter and the transmission path of the third communication signal including the third filter.

In the high-frequency module, the frequency of the first communication signal is preferably lower than the frequency of the third communication signal. A low-pass-filter phase circuit is preferably provided at least one of between the first filter and the first individual terminal and between the second filter and the second individual terminal.

With the above configuration, the low-pass-filter phase circuit is provided on the path through which the communication signal having a relatively low frequency is transmitted to improve the isolation.

The high-frequency module may further include a fourth filter having a frequency of a fourth communication signal whose frequency is close to the frequency of the third communication signal as the pass band. The fourth filter is preferably connected to a third individual terminal in the switch IC.

In the high-frequency module having the above configuration, the fourth communication signal different from the first communication signal, the second communication signal, and the third communication signal is also transmitted and received. The fourth communication signal is, for example, a communication signal that is not selected as the third communication signal when multiple candidates for the third communication signal exist. Since the fourth communication signal is transmitted through the individual terminal different from the individual terminal through which the third communication signal is transmitted, it is possible to ensure high isolation between the first communication signal, the second communication signal, the third communication signal, and the fourth communication signal.

The high-frequency module may further include a fourth filter having a frequency of a fourth communication signal whose frequency is close to the frequency of the third communication signal as the pass band. The fourth filter is preferably connected to the second individual terminal in the switch IC.

Also in the high-frequency module having the above configuration, the fourth communication signal different from the first communication signal, the second communication signal, and the third communication signal is transmitted and received. Since the fourth communication signal is transmitted through the individual terminal different from the individual terminal through which the third communication signal is transmitted, it is possible to ensure high isolation between the first communication signal, the second communication signal, the third communication signal, and the fourth communication signal. In addition, since the second communication signal and the fourth communication signal are transmitted through the same individual terminal, the number of the individual terminals can be decreased to realize a more compact high-frequency module.

In the high-frequency module, the frequencies of the first communication signal and the second communication signal are preferably lower than the frequency of the fourth communication signal. A high-pass-filter phase circuit is preferably provided at least one of between the third filter and the first individual terminal and between the fourth filter and the individual terminal connected to the fourth filter.

With the above configuration, since the high-pass-filter phase circuit is provided on the path on which the communication signal having a relatively high frequency is transmitted, it is possible to further improve the isolation.

In the high-frequency module, the first filter, the second filter, the third filter, and the fourth filter are preferably mounted filters mounted in a multilayer body including dielectric layers. The first filter, the second filter, the third filter, and the fourth filter are preferably mounted in any of the following mounting modes: (A) the first filter is mounted so as to be close to the third filter, (B) the second filter is mounted so as to be close to the fourth filter, or (C) the first filter is mounted so as to be close to the third filter and the second filter is mounted so as to be close to the fourth filter.

The above configurations indicate the specific mounting modes of the filters. The filters whose pass bands are far from each other can be mounted so as to be close to each other to ensure isolation even in the compact high-frequency module.

In the high-frequency module, a package duplexer is preferably including the first filter, the second filter, the third filter, and the fourth filter in any of the following modes: (A) the first filter and the third filter define a package duplexer, (B) the second filter and the fourth filter define a package duplexer, or (C) the first filter and the third filter define a package duplexer and the second filter and the fourth filter define a package duplexer.

The above configurations indicate the specific configuration modes of the duplexer resulting from combinations of the filters. The duplexer can include the filters whose pass bands are far from each other to realize the compact high-frequency module with high isolation ensured.

According to various preferred embodiments of the present invention, it is possible to transmit two communication signals whose frequencies are close to each other to different ports with low loss even in the configuration in which multiple communication signals including the two communication signals whose frequencies are close to each other are switched via the common antenna to transmit and receive the communication signal after the switching.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
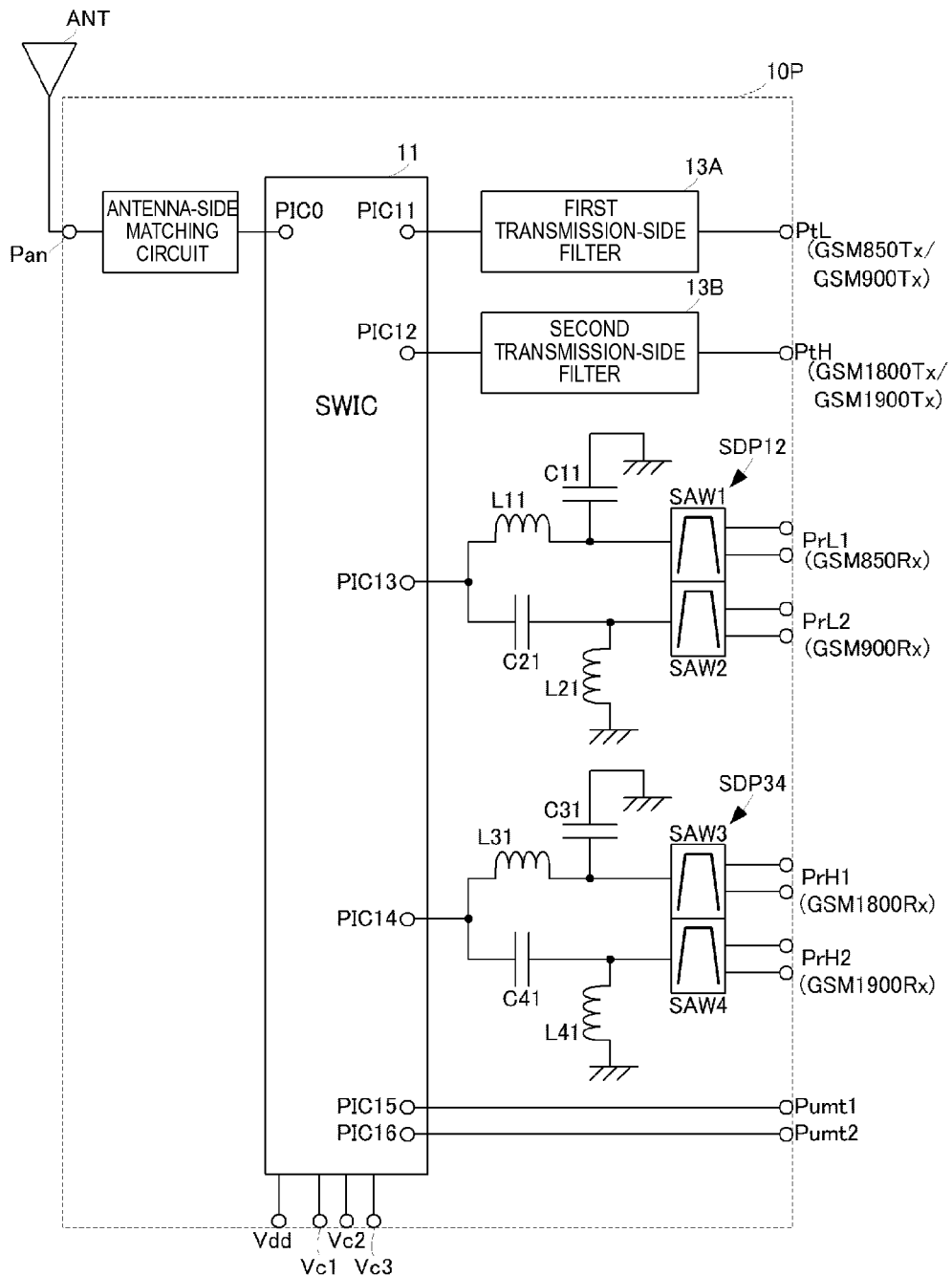
FIG. 1 is a diagram showing the circuit configuration of a high-frequency module in the related art.
Figure 2:
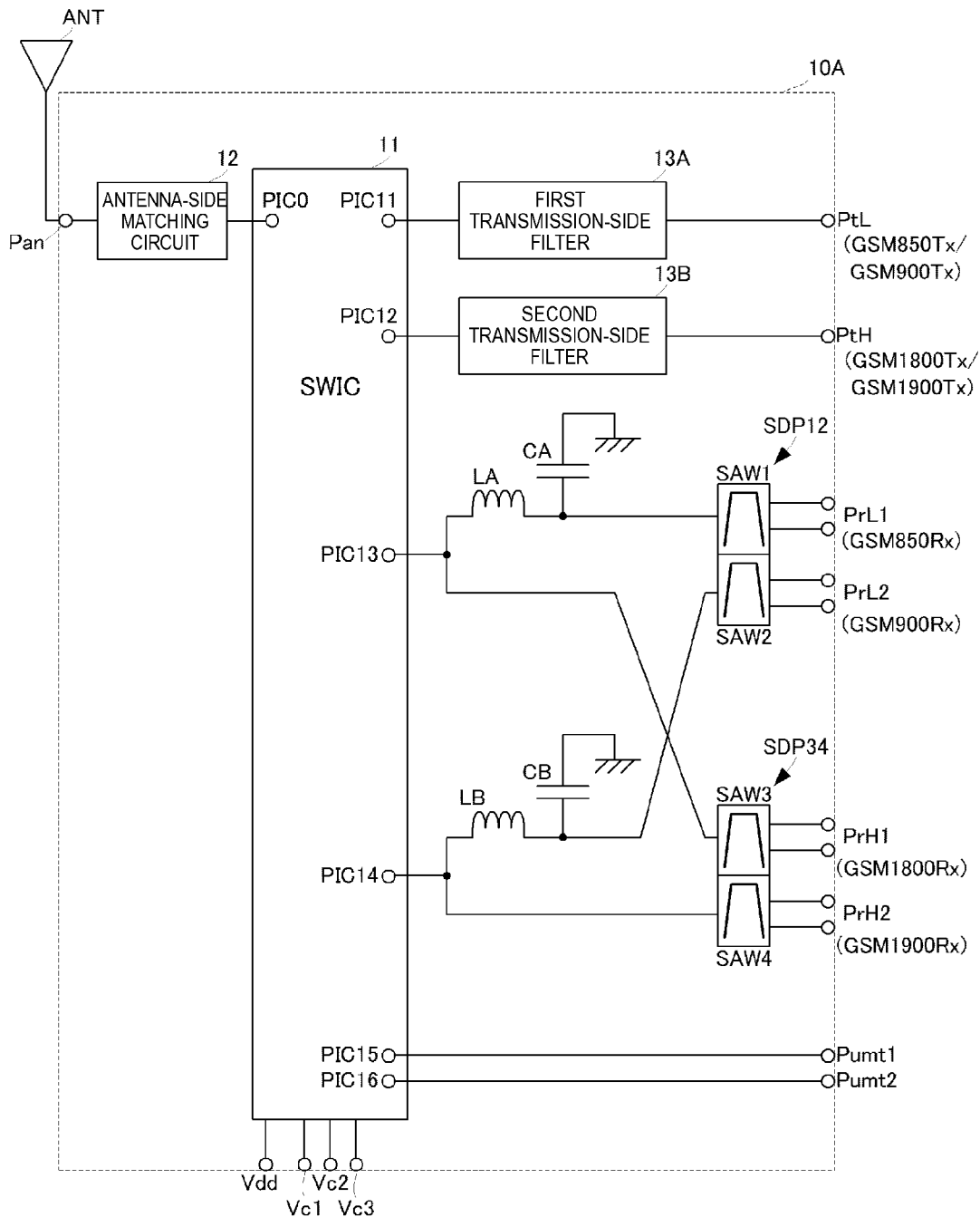
FIG. 2 is a diagram showing an example of the circuit configuration of a high-frequency module of a first preferred embodiment of the present invention.

A high-frequency module according to a first preferred embodiment of the present invention will now be described with reference to the drawings. The high-frequency module is exemplified by a high-frequency switch module that transmits and receives a GSM850 communication signal (having a frequency within an about 850-MHz band), a GSM900 communication signal (having a frequency within a 900-MHz band), a GSM1800 communication signal (having a frequency within a 1800-MHz band), and a GSM1900 communication signal (having a frequency within a 1900-MHz band) in the present preferred embodiment. FIG. 2 is a diagram showing an example of the circuit configuration of a high-frequency module 10A of the first preferred embodiment.

The high-frequency module 10A includes a switch IC 11, an antenna-side matching circuit 12, a first transmission-side filter 13A, a second transmission-side filter 13B, and SAW duplexers SDP12 and SDP34. The SAW duplexer SDP12 includes a SAW filter SAW1 and a SAW filter SAW2. The SAW duplexer SDP34 includes a SAW filter SAW3 and a SAW filter SAW4.

The high-frequency module 10A includes a multilayer body in which a certain number of dielectric layers are laminated, circuit elements in the multilayer body, and circuit elements mounted on the top surface of the multilayer body.

The switch IC 11 and the SAW duplexers SDP12 and SDP34 are mounted circuit elements and are mounted on the top surface of the multilayer body.

The antenna-side matching circuit 12 and the first and second transmission-side filters 13A and 13B schematically include inductors and capacitors. The inductors and the capacitors of the antenna-side matching circuit 12 and the first and second transmission-side filters 13A and 13B are appropriately defined by either of inner-layer electrode patterns in the multilayer body and mounted circuit elements.

The switch IC 11 includes a common terminal PIC0 and multiple (for example, preferably six in the present preferred embodiment) individual terminals PIC11 to PIC16. A drive voltage Vdd and control voltages Vc1, Vc2, and Vc3 are applied to the switch IC 11. The switch IC 11 is driven in response to the drive voltage Vdd that is applied. In the switch IC 11, the common terminal PIC0 is connected to any of the individual terminals PIC11 to PIC16 in accordance with a combination of High and Low of the control voltages Vc1, Vc2, and Vc3.

The common terminal PIC0 in the switch IC 11 is connected to an antenna port Pan of the high-frequency module 10A via the antenna-side matching circuit 12. The antenna-side matching circuit 12 functions as a phase matching circuit and an electrostatic discharge (ESD) protection circuit in accordance with the connection configuration of the inductors and the capacitors, which is appropriately set.

The individual terminal PIC11 in the switch IC 11 is connected to a first transmission signal input port PtL of the high-frequency module 10A via the first transmission-side filter 13A. A GSM850 transmission signal or a GSM900 transmission signal is input through the first transmission signal input port PtL. The first transmission-side filter 13A has characteristics in that the transmission frequency bands of the GSM850 communication signal and the GSM900 communication signal are included in the pass band thereof and high-level harmonics including second harmonics and third harmonics of the GSM850 communication signal and the GSM900 communication signal are included in the attenuation band thereof.

The individual terminal PIC12 in the switch IC 11 is connected to a second transmission signal input port PtH of the high-frequency module 10A via the second transmission-side filter 13B. A GSM1800 transmission signal or a GSM1900 transmission signal is input through the second transmission signal input port PtH. The second transmission-side filter 13B has characteristics in that the transmission frequency bands of the GSM1800 communication signal and the GSM1900 communication signal are included in the pass band thereof and high-level harmonics including second harmonics and third harmonics of the GSM1800 communication signal and the GSM1900 communication signal are included in the attenuation band thereof.

The individual terminal PIC13 in the switch IC 11 is connected to the SAW filter SAW1 in the SAW duplexer SDP12 and the SAW filter SAW3 in the SAW duplexer SDP34.

The SAW filter SAW1 preferably is a SAW filter having a balanced-unbalanced transforming function and preferably is a filter using the reception frequency band of the GSM850 communication signal as the pass band. The unbalanced terminal of the SAW filter SAW1 is connected to the individual terminal PIC13 and the balanced terminal of the SAW filter SAW1 is connected to a first reception signal output port PrL1 of the high-frequency module 10A.

The SAW filter SAW3 preferably is a SAW filter having the balanced-unbalanced transforming function and preferably is a filter using the reception frequency band of the GSM1800 communication signal as the pass band. The unbalanced terminal of the SAW filter SAW3 is connected to the individual terminal PIC13 and the balanced terminal of the SAW filter SAW3 is connected to a third reception signal output port PrH1 of the high-frequency module 10A.

An inductor LA is connected between the individual terminal PIC13 and the SAW filter SAW1 and the SAW filter SAW1 side of the inductor LA is grounded via a capacitor CA, defining an L-type low pass filter circuit including the inductor LA and the capacitor CA. Providing a phase circuit including the low pass filter circuit and appropriately setting the element values of the inductor LA and the capacitor CA allows high isolation to be ensured between the transmission path at the SAW filter SAW1 side through which the GSM850 communication signal is transmitted and the transmission path at the SAW filter SAW3 side through which the GSM1800 communication signal is transmitted. In other words, it is possible to ensure high isolation between the transmission path at the SAW filter SAW1 side connected to the individual terminal PIC13, which is relatively at a lower frequency side, and the transmission path at the SAW filter SAW3 side connected to the individual terminal PIC13, which is far from the pass band of the SAW filter SAW1 by a certain frequency or more and which is relatively at a higher frequency side.

The individual terminal PIC14 in the switch IC 11 is connected to the SAW filter SAW2 in the SAW duplexer SDP12 and the SAW filter SAW4 in the SAW duplexer SDP34.

The SAW filter SAW2 preferably is a SAW filter having the balanced-unbalanced transforming function and preferably is a filter using the reception frequency band of the GSM900 communication signal as the pass band. The unbalanced terminal of the SAW filter SAW2 is connected to the individual terminal PIC14 and the balanced terminal of the SAW filter SAW2 is connected to a second reception signal output port PrL2 of the high-frequency module 10A.

The SAW filter SAW4 preferably is a SAW filter having the balanced-unbalanced transforming function and preferably is a filter using the reception frequency band of the GSM1900 communication signal as the pass band. The unbalanced terminal of the SAW filter SAW4 is connected to the individual terminal PIC14 and the balanced terminal of the SAW filter SAW4 is connected to a fourth reception signal output port PrH2 of the high-frequency module 10A.

An inductor LB is connected between the individual terminal PIC14 and the SAW filter SAW2 and the SAW filter SAW2 side of the inductor LB is grounded via a capacitor CB, defining an L-type low pass filter circuit including the inductor LB and the capacitor CB. Providing a phase circuit including the low pass filter circuit and appropriately setting the element values of the inductor LB and the capacitor CB allows high isolation to be ensured between the transmission path at the SAW filter SAW2 side through which the GSM900 communication signal is transmitted and the transmission path at the SAW filter SAW4 side through which the GSM1900 communication signal is transmitted. In other words, it is possible to ensure high isolation between the transmission path at the SAW filter SAW2 side connected to the individual terminal PIC14, which is relatively at a lower frequency side, and the transmission path at the SAW filter SAW4 side connected to the individual terminal PIC14, which is far from the pass band of the SAW filter SAW2 by a certain frequency or more and which is relatively at a higher frequency side.

Figure 3A:
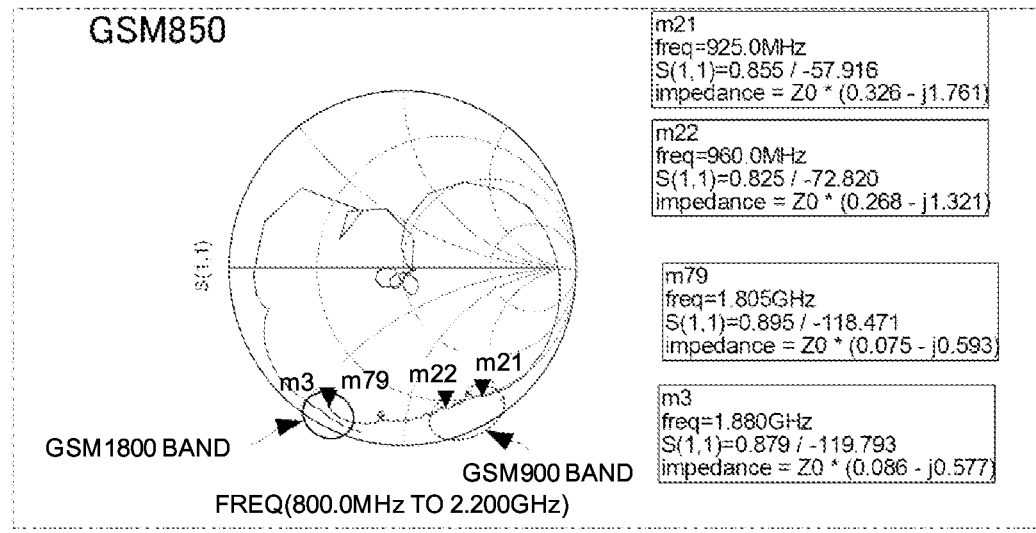
FIGS. 3A to 3D are Smith charts for describing a concept that determines combinations of communication signals in the first preferred embodiment of the present invention.
Figure 3B:
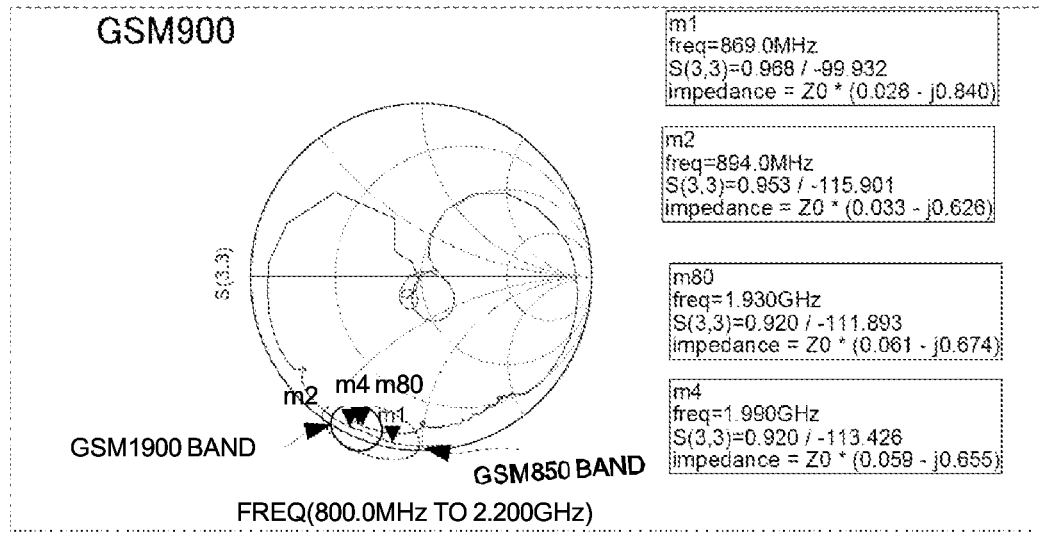
Figure 3C:
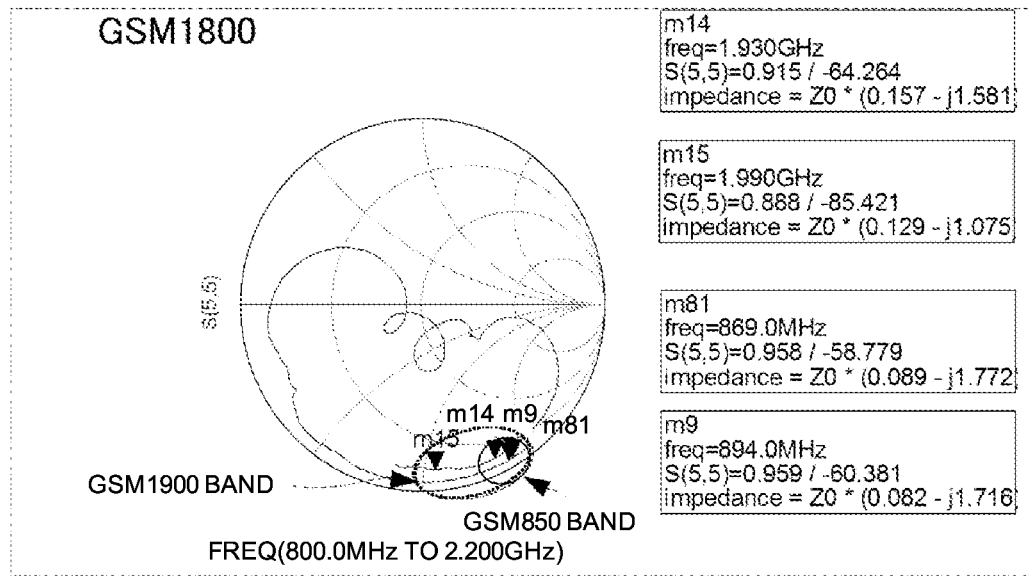
Figure 3D:
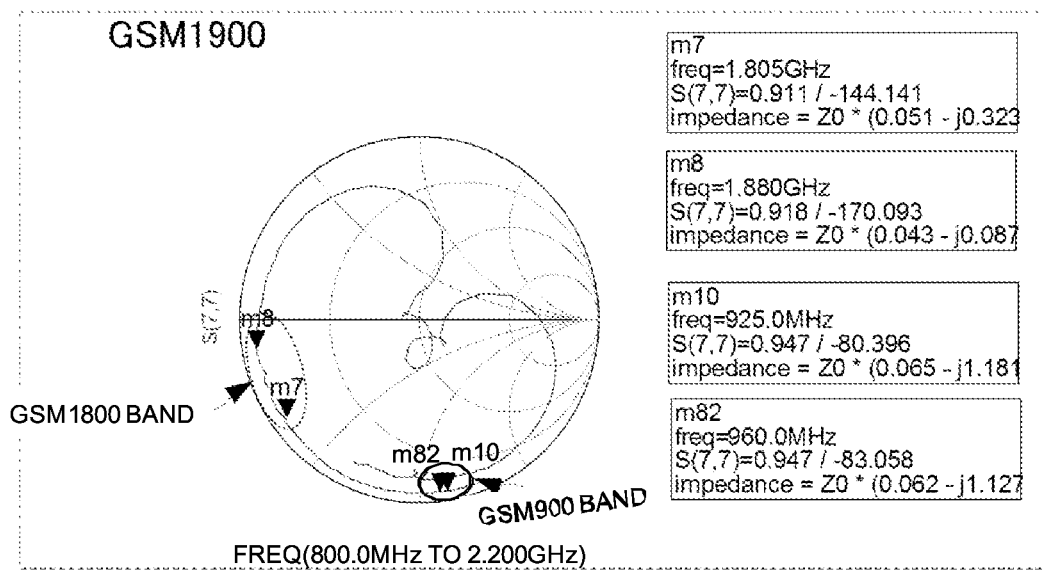

Combinations of the communication signals connected to one individual terminal are based on the following concept. FIGS. 3A to 3D are Smith charts for describing the concept that determines the combinations of the communication signals. FIG. 3A shows input impedance characteristics of the SAW filter SAW1 for the GSM850 communication signal, FIG. 3B shows input impedance characteristics of the SAW filter SAW2 for the GSM900 communication signal, FIG. 3C shows input impedance characteristics of the SAW filter SAW3 for the GSM1800 communication signal, and FIG. 3D shows input impedance characteristics of the SAW filter SAW4 for the GSM1900 communication signal.

As shown in FIG. 3A, in the SAW filter SAW1 for the GSM850 communication signal, the input impedance of the frequency band of the GSM1800 communication signal is higher than that of the frequency band of the GSM900 communication signal (toward the periphery of the Smith chart).

Similarly, as shown in FIG. 3C, in the SAW filter SAW3 for the GSM1800 communication signal, the input impedance of the frequency band of the GSM850 communication signal is higher than that of the frequency band of the GSM1900 communication signal.

Accordingly, it is possible to achieve higher isolation in the configuration (the configuration in the present preferred embodiment) in which the transmission path for the GSM850 communication signal including the SAW filter SAW1 and the transmission path for the GSM1800 communication signal including the SAW filter SAW3 are connected to the individual terminal PIC13, compared with the configuration (the configuration in the related art) in which the transmission path for the GSM850 communication signal including the SAW filter SAW1 and the transmission path for the GSM900 communication signal including the SAW filter SAW2 are connected to the individual terminal PIC13.

Furthermore, as shown in FIG. 3C, the amount of variation (a portion surrounded by a solid line) in the input impedance within the frequency band of the GSM850 communication signal is smaller than the amount of variation (a portion surrounded by a broken line) in the input impedance within the frequency band of the GSM1900 communication signal in the SAW filter SAW3. Accordingly, the phase can be shifted toward the open side (toward the right side of the Smith chart) with the above phase circuit including the inductor and the capacitor to arrange the substantially entire area of the frequency band of the GSM850 communication signal at the substantially open position. As a result, it is possible to further improve the isolation.

As shown in FIG. 3B, in the SAW filter SAW2 for the GSM900 communication signal, the input impedance of the frequency band of the GSM1900 communication signal is higher than that of the frequency band of the GSM850 communication signal (toward the periphery of the Smith chart).

Similarly, as shown in FIG. 3D, in the SAW filter SAW4 for the GSM1900 communication signal, the input impedance of the frequency band of the GSM900 communication signal is higher than that of the frequency band of the GSM1800 communication signal.

Accordingly, it is possible to achieve higher isolation in the configuration (the configuration in the present preferred embodiment) in which the transmission path for the GSM900 communication signal including the SAW filter SAW2 and the transmission path for the GSM1900 communication signal including the SAW filter SAW4 are connected to the individual terminal PIC14, compared with the configuration (the configuration in the related art) in which the transmission path for the GSM1800 communication signal including the SAW filter SAW3 and the transmission path for the GSM1900 communication signal including the SAW filter SAW4 are connected to the individual terminal PIC14.

Furthermore, as shown in FIG. 3D, the amount of variation (a portion surrounded by a solid line) in the input impedance within the frequency band of the GSM900 communication signal is smaller than the amount of variation (a portion surrounded by a broken line) in the input impedance within the frequency band of the GSM1800 communication signal in the SAW filter SAW4. Accordingly, the phase can be shifted toward the open side (toward the right side of the Smith chart) with the above phase circuit including the inductor and the capacitor to arrange the substantially entire area of the frequency band of the GSM900 communication signal at the substantially open position. As a result, it is possible to further improve the isolation.

Figure 4A:
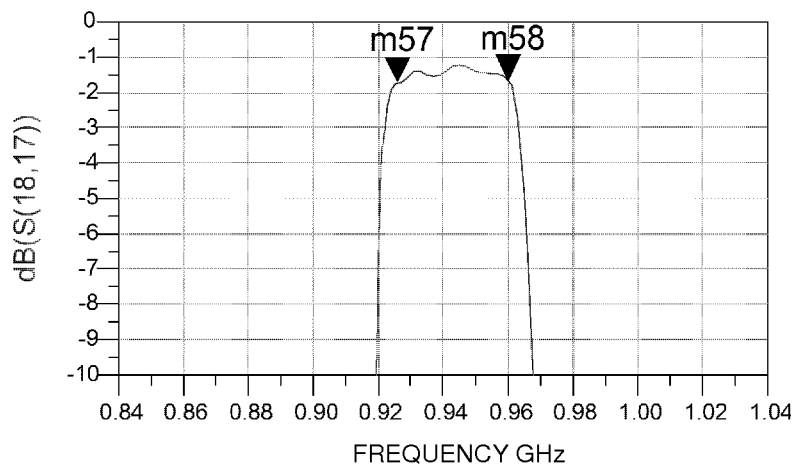
FIG. 4A shows a transmission characteristic of a GSM900 communication signal in the high-frequency module of the first preferred embodiment of the present invention and FIG. 4B shows a transmission characteristic of the GSM900 communication signal in the high-frequency module in the related art.
Figure 4B:
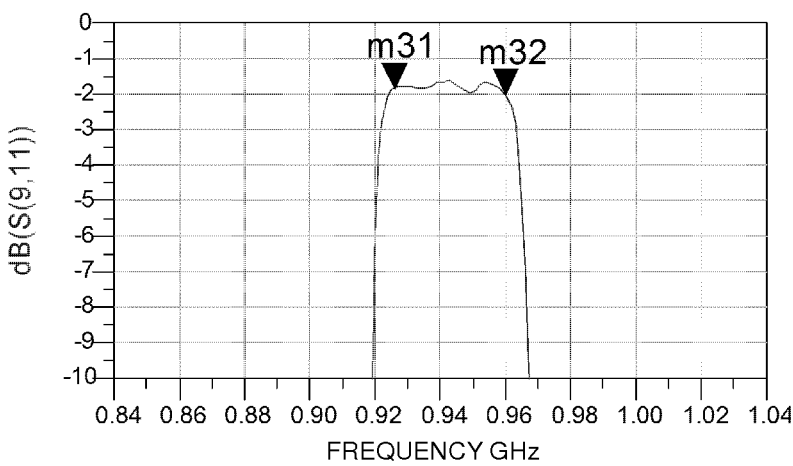

FIGS. 4A and 4B show transmission characteristics of the GSM900 reception signal in the high-frequency module 10A of the present preferred embodiment and the high-frequency module 10P in the related art. FIG. 4A shows the case in the high-frequency module 10A of the present preferred embodiment. FIG. 4B shows the case in the high-frequency module 10P in the related art.

As shown in FIGS. 4A and 4B, with the configuration of the present preferred embodiment, it is possible to reduce the loss to transmit the GSM900 reception signal with low loss. The configuration of the present preferred embodiment can be used to reduce the losses in the other communication signals, as apparent from the relationship shown in the Smith charts in FIGS. 3A to 3D, although not shown in FIGS. 4A and 4B.

As described above in the present preferred embodiment, two communication signals having frequency bands that are far from each other can be allocated to one individual terminal to realize the high-frequency module with lower loss, compared with the configuration in the related art in which two communication signals having frequency bands that are close to each other are allocated to one individual terminal.

Figure 5:
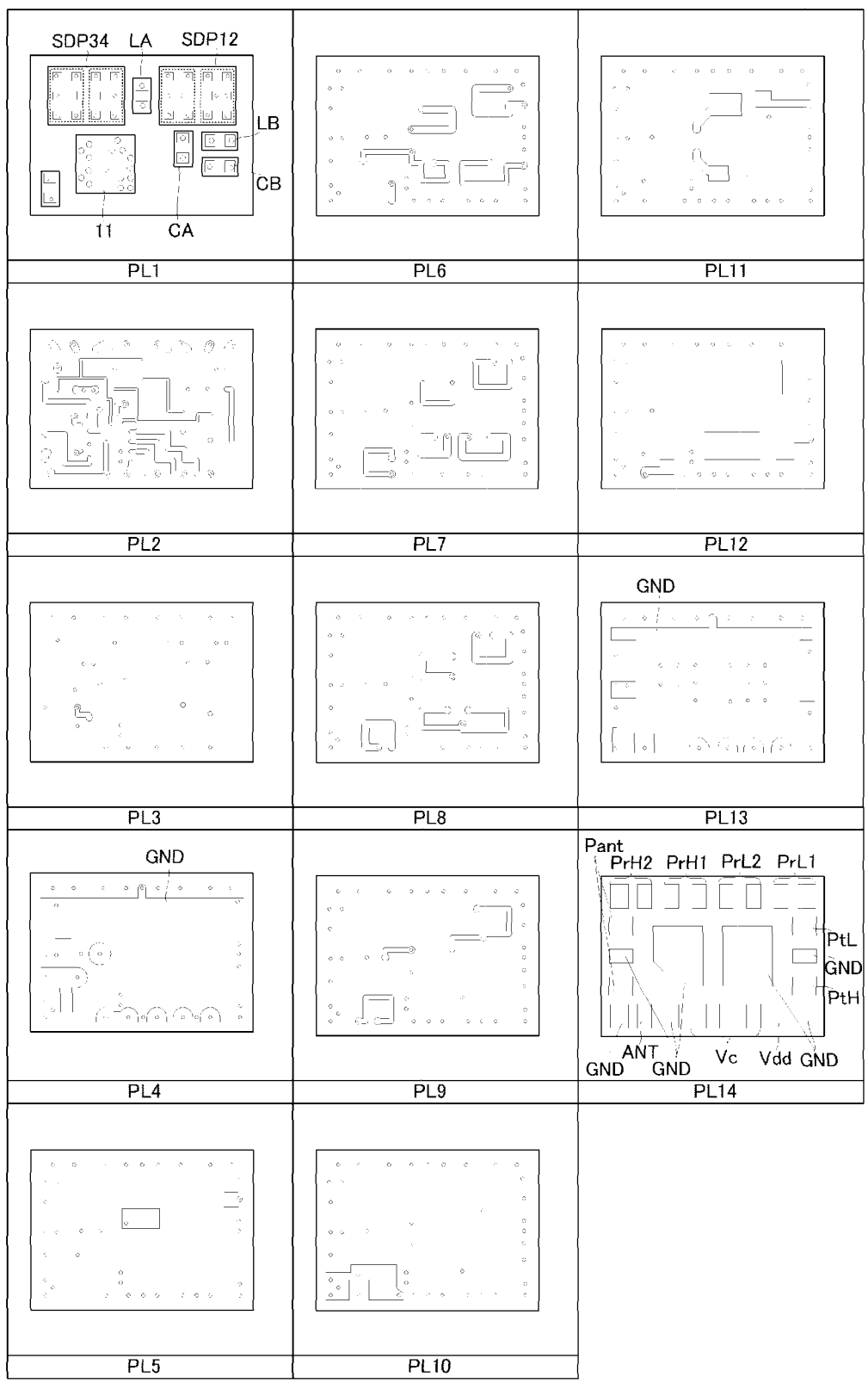
FIG. 5 is a layer diagram of the high-frequency module of the first preferred embodiment of the present invention.

The high-frequency module 10A having the above circuit configuration has the following structure. Specifically, the high-frequency module 10A includes a multilayer body in which multiple dielectric layers PL1 to PL14 are laminated and various mounted circuit elements mounted on the top surface of the multilayer body. FIG. 5 is a layer diagram of the high-frequency module 10A of the present preferred embodiment. In the layer diagram in FIG. 5, the top layer at the top-surface side of the multilayer body corresponds to the first layer PL1 and the bottom layer corresponds to the fourteenth layer PL14. FIG. 5 is a plan view of electrode patterns from the bottom side. Circles indicated in the respective layers in FIG. 5 denote conductive via holes connecting the layers.

Element mounted lands on which the mounted circuit elements including the switch IC 11, the SAW duplexers SDP12 and SDP34, the inductors LA and LB, and the capacitors CA and CB are mounted are arranged at the top-surface side of the first layer PL1.

The SAW duplexer SDP12 is a mounted circuit element in which the SAW filter SAW1 and the SAW filter SAW2 are incorporated in a single casing. The SAW duplexer SDP34 is a mounted circuit element in which the SAW filter SAW3 and the SAW filter SAW4 are incorporated in a single casing.

Wiring pattern electrodes are arranged on the second layer PL2 and the third layer PL3. The wiring pattern electrodes wire the respective element mounted lands on the first layer PL1 into electrode portions on lower layers of the multilayer body.

An inner-layer ground electrode GND is arranged on the substantially entire area of the fourth layer PL4.

The circuit elements of the antenna-side matching circuit 12, the first transmission-side filter 13A, and the second transmission-side filter 13B, excluding the circuit elements realized by the above mounted circuit elements, are arranged on the fifth layer PL5 to the twelfth layer PL12 as inner-layer electrode patterns.

An inner-layer ground electrode GND is arranged on the substantially entire area of the thirteenth layer PL13.

Various external connection lands are arranged on the bottom-surface side of the fourteenth layer PL14 of the bottom surface of the multilayer body. External connection ground electrodes GNDs are arranged at the central portion in a plan view of the fourteenth layer PL14.

The external connection lands corresponding to the first reception signal output port PrL1, the second reception signal output port PrL2, the third reception signal output port PrH1, and the fourth reception signal output port PrH2 are aligned and arranged along the longitudinal direction near one side surface along the longitudinal direction of the fourteenth layer PL14.

The external connection lands arranged to apply the drive voltage Vdd and the control voltages Vc1 to Vc3 (corresponding to Vdd, Vc1, Vc2, and Vc3 in FIG. 2) and the external connection land corresponding to the antenna port Pan are aligned and arranged along the longitudinal direction near the other side surface along the longitudinal direction of the fourteenth layer PL14.

The external connection lands corresponding to the first transmission signal input port PtL and the second transmission signal input port PtH are arranged along the latitudinal direction near one side surface along the latitudinal direction of the fourteenth layer PL14.

The external connection lands corresponding to first and second input-output ports Pumt1 and Pumt2 are arranged along the latitudinal direction near the other side surface along the latitudinal direction of the fourteenth layer PL14.

The high-frequency module 10A including the multilayer body and the mounted circuit elements mounted on the multilayer body preferably has the above structure.

The use of the configuration described above in which multiple SAW filters are connected to one individual terminal in the switch IC 11 allows the multilayer body to be reduced in size, compared with the configuration in which one SAW filter is connected to each individual terminal.

The use of the configuration of the present preferred embodiment (devising the combinations of two SAW filters connected to each individual terminal), in addition to the configuration in which multiple SAW filters are connected to one individual terminal in the switch IC 11, allows the compact high-frequency module capable of ensuring high isolation between the transmission paths of the communication signals to be realized.

Figure 6:
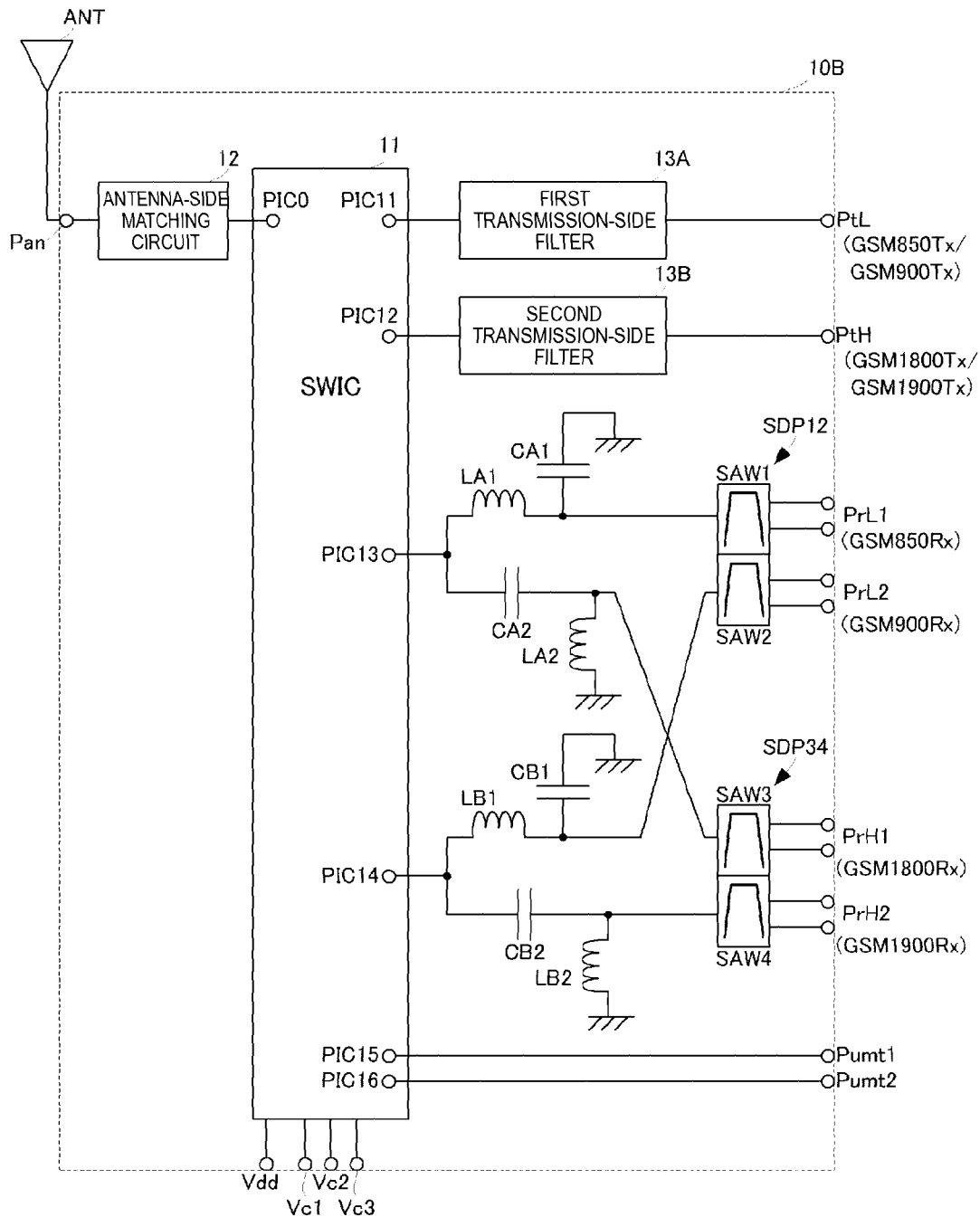
FIG. 6 is a diagram showing an example of the circuit configuration of a high-frequency module of a second preferred embodiment of the present invention.

A high-frequency module according to a second preferred embodiment will now be described with reference to FIG. 6. FIG. 6 is a diagram showing an example of the circuit configuration of a high-frequency module 10B of the second preferred embodiment.

The high-frequency module 10B of the present preferred embodiment differs from the high-frequency module 10A of the first preferred embodiment in the circuit configuration connected to the individual terminals PIC13 and PIC14 in the switch IC 11, and the high-frequency module 10B of the present preferred embodiment is the same as the high-frequency module 10A of the first preferred embodiment in the remaining configuration. Only the difference from the high-frequency module 10A of the first preferred embodiment will be described here.

A capacitor CA2 is connected between the individual terminal PIC13 in the switch IC 11 and the SAW filter SAW3 in the SAW duplexer SDP34 and the SAW filter SAW3 side of the capacitor CA2 is grounded via an inductor LA2, defining an L-type high pass filter circuit including the capacitor CA2 and the inductor LA2. Providing a phase circuit including the high pass filter circuit and appropriately setting the element values of the capacitor CA2 and the inductor LA2 allows higher isolation to be ensured between the transmission path at the SAW filter SAW1 side through which the GSM850 communication signal is transmitted and the transmission path at the SAW filter SAW3 side through which the GSM1800 communication signal is transmitted.

A capacitor CB2 is connected between the individual terminal PIC14 in the switch IC 11 and the SAW filter SAW4 in the SAW duplexer SDP34 and the SAW filter SAW4 side of the capacitor CB2 is grounded via an inductor LB2, defining an L-type high pass filter circuit including the capacitor CB2 and the inductor LB2. Providing a phase circuit including the high pass filter circuit and appropriately setting the element values of the capacitor CB2 and the inductor LB2 allows higher isolation to be ensured between the transmission path at the SAW filter SAW2 side through which the GSM900 communication signal is transmitted and the transmission path at the SAW filter SAW4 side through which the GSM1900 communication signal is transmitted.

Figure 7:
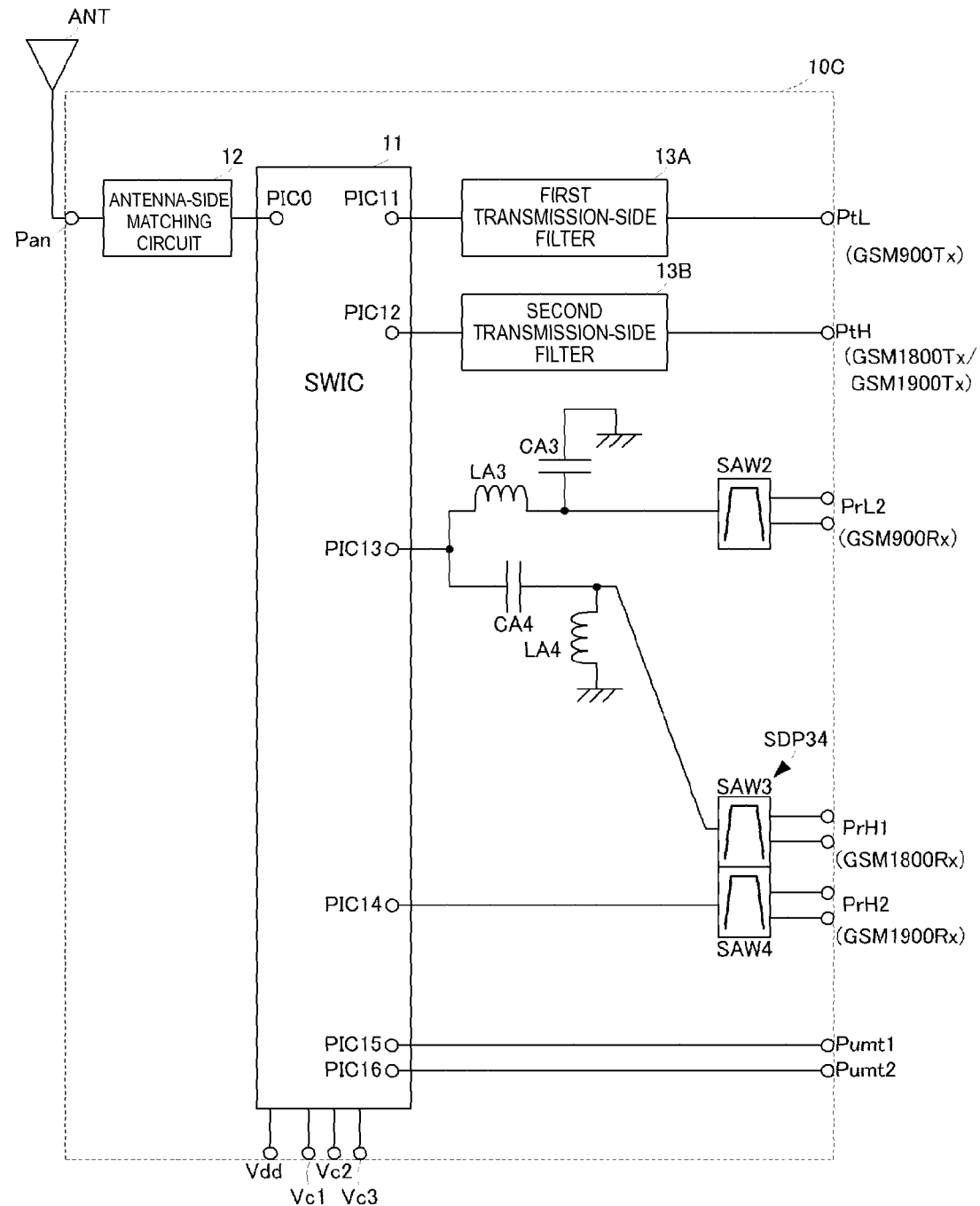
FIG. 7 is a diagram showing an example of the circuit configuration of a high-frequency module of a third preferred embodiment of the present invention.

A high-frequency module according to a third preferred embodiment will now be described with reference to FIG. 7. FIG. 7 is a diagram showing an example of the circuit configuration of a high-frequency module 10C of the third preferred embodiment.

The high-frequency module 10C of the present preferred embodiment switches between the GSM900 communication signal, the GSM1800 communication signal, and the GSM1900 communication signal to transmit and receive the communication signal after the switching. Since the high-frequency module 10C basically differs from the high-frequency module 10A in the circuit configuration of the reception system of the switch IC 11, only the circuit configuration of the reception system will be specifically described here.

The individual terminal PIC13 in the switch IC 11 is connected to the single SAW filter SAW2 and the SAW filter SAW3 in the SAW duplexer SDP34.

The unbalanced terminal of the SAW filter SAW2 is connected to the individual terminal PIC13 and the balanced terminal of the SAW filter SAW2 is connected to the second reception signal output port PrL2 of the high-frequency module 10C. The unbalanced terminal of the SAW filter SAW3 is connected to the individual terminal PIC13 and the balanced terminal of the SAW filter SAW3 is connected to the third reception signal output port PrH1 of the high-frequency module 10C.

An inductor LA3 is connected between the individual terminal PIC13 and the SAW filter SAW2 and the SAW filter SAW2 side of the inductor LA3 is grounded via a capacitor CA3, defining an L-type low pass filter circuit including the inductor LA3 and the capacitor CA3.

A capacitor CA4 is connected between the individual terminal PIC13 and the SAW filter SAW3 and the SAW filter SAW3 side of the capacitor CA4 is grounded via an inductor LA4, defining an L-type high pass filter circuit including the capacitor CA4 and the inductor LA4.

Providing phase circuits including the low pass filter circuit and the high pass filter circuit and appropriately setting the element values of the inductors LA3 and LA4 and the capacitors CA3 and CA4 allows high isolation to be ensured between the transmission path at the SAW filter SAW2 side through which the GSM900 communication signal is transmitted and the transmission path at the SAW filter SAW3 side through which the GSM1800 communication signal is transmitted.

The individual terminal PIC14 in the switch IC 11 is connected to the SAW filter SAW4 in the SAW duplexer SDP34. Although the SAW filter SAW4 is integrated with the SAW filter SAW3 to define the SAW duplexer SDP34, the SAW filter SAW4 is connected to the individual terminal different from the individual terminal to which the SAW filter SAW3 is connected and, thus, high isolation can also be ensured between the transmission path for the GSM1900 communication signal and the transmission path for another communication (for example, the GSM1800 communication signal).

Figure 8:
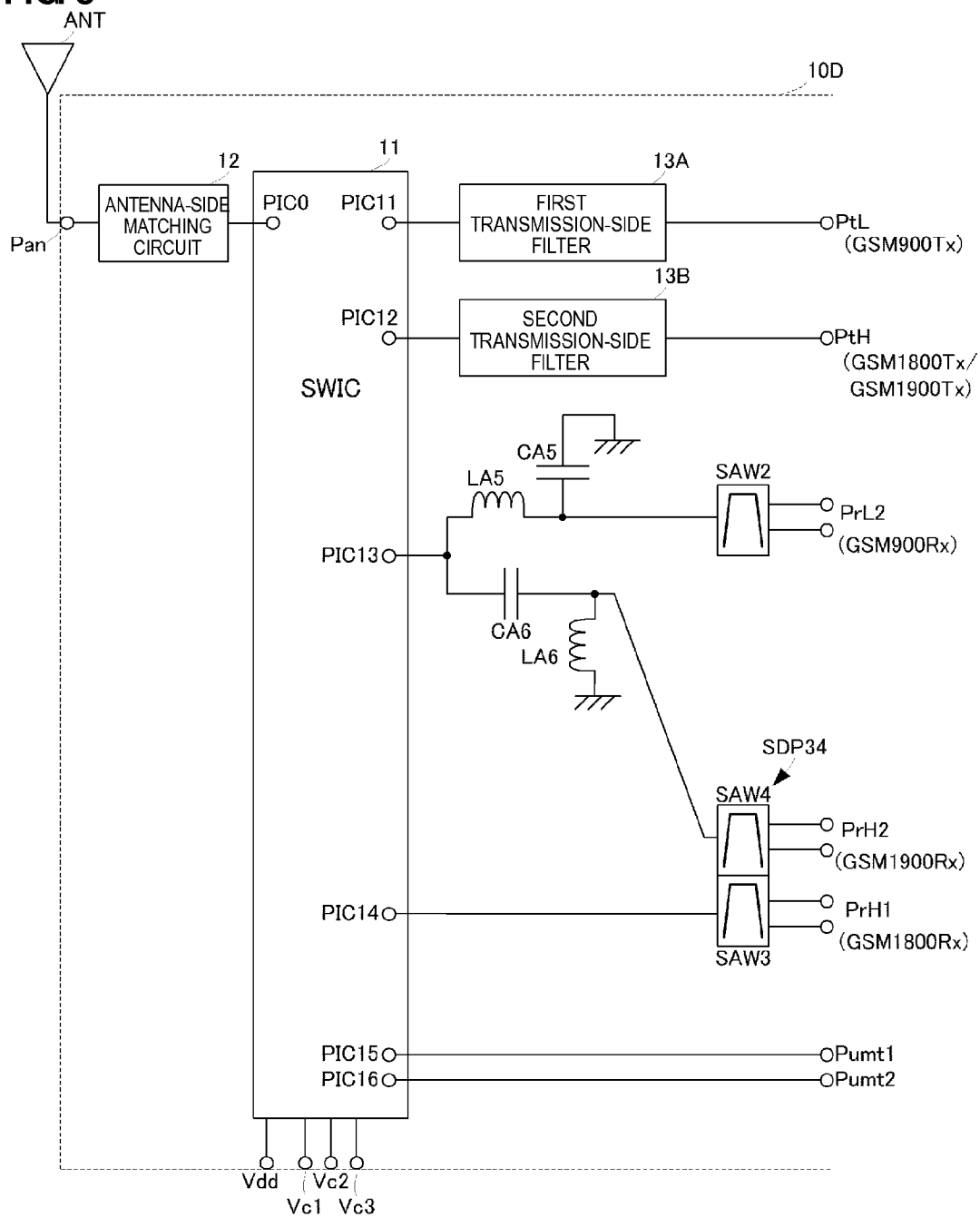
FIG. 8 is a diagram showing an example of the circuit configuration of a high-frequency module of a fourth preferred embodiment of the present invention.

A high-frequency module according to a fourth preferred embodiment will now be described with reference to FIG. 8. FIG. 8 is a diagram showing an example of the circuit configuration of a high-frequency module 10D of the fourth preferred embodiment. The high-frequency module 10D of the present preferred embodiment switches between the GSM900 communication signal, the GSM1800 communication signal, and the GSM1900 communication signal to transmit and receive the communication signal after the switching, like the high-frequency module 10C of the third preferred embodiment. The high-frequency module 10D of the present preferred embodiment differs from the high-frequency module 10C of the third preferred embodiment in that the SAW filter SAW4 is connected to the individual terminal PIC13 and the SAW filter SAW3 is connected to the individual terminal PIC14.

The individual terminal PIC13 in the switch IC 11 is connected to the single SAW filter SAW2 and the SAW filter SAW4 in the SAW duplexer SDP34.

The unbalanced terminal of the SAW filter SAW2 is connected to the individual terminal PIC13 and the balanced terminal of the SAW filter SAW2 is connected to the second reception signal output port PrL2 of the high-frequency module 10D. The unbalanced terminal of the SAW filter SAW4 is connected to the individual terminal PIC13 and the balanced terminal of the SAW filter SAW4 is connected to the fourth reception signal output port PrH2 of the high-frequency module 10D.

An inductor LA5 is connected between the individual terminal PIC13 and the SAW filter SAW2 and the SAW filter SAW2 side of the inductor LA5 is grounded via a capacitor CA5, defining an L-type low pass filter circuit including the inductor LA5 and the capacitor CA5.

A capacitor CA6 is connected between the individual terminal PIC13 and the SAW filter SAW4 and the SAW filter SAW4 side of the capacitor CA6 is grounded via an inductor LA6, defining an L-type high pass filter circuit including the capacitor CA6 and the inductor LA6.

Providing phase circuits including the low pass filter circuit and the high pass filter circuit and appropriately setting the element values of the inductors LA5 and LA6 and the capacitors CA5 and CA6 allows high isolation to be ensured between the transmission path at the SAW filter SAW2 side through which the GSM900 communication signal is transmitted and the transmission path at the SAW filter SAW4 side through which the GSM1900 communication signal is transmitted.

The individual terminal PIC14 in the switch IC 11 is connected to the SAW filter SAW3 in the SAW duplexer SDP34. Although the SAW filter SAW3 is integrated with the SAW filter SAW4 to define the SAW duplexer SDP34, the SAW filter SAW3 is connected to the individual terminal different from the individual terminal to which the SAW filter SAW4 is connected and, thus, high isolation can also be ensured between the transmission path for the GSM1800 communication signal and the transmission path for another communication (for example, the GSM1900 communication signal).

Figure 9:
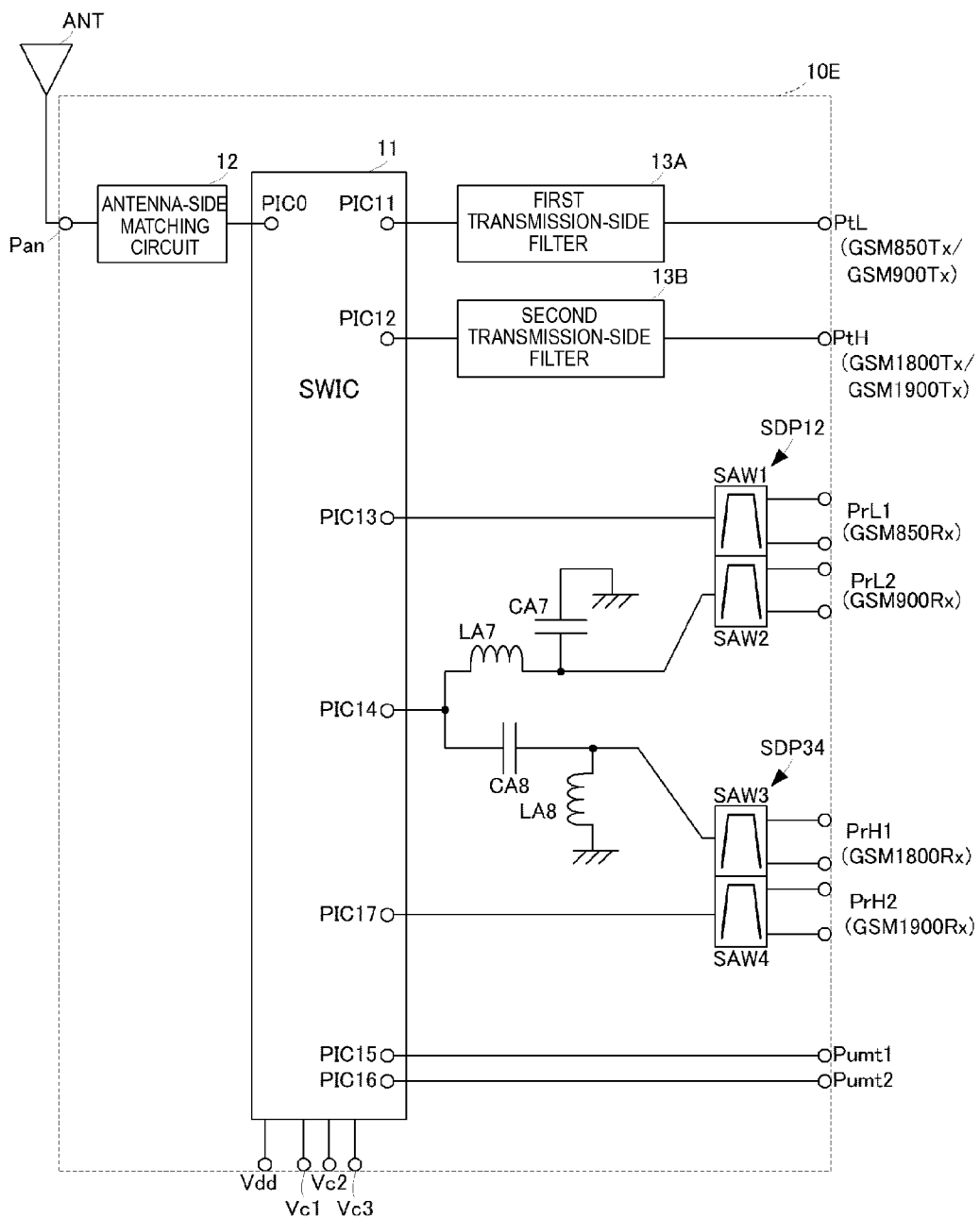
FIG. 9 is a diagram showing an example of the circuit configuration of a high-frequency module of a fifth preferred embodiment of the present invention.

A high-frequency module according to a fifth preferred embodiment will now be described with reference to FIG. 9. FIG. 9 is a diagram showing an example of the circuit configuration of a high-frequency module 10E of the fifth preferred embodiment. Since the high-frequency module 10E of the present preferred embodiment basically differs from the high-frequency module 10A in the circuit configuration of the reception system of the switch IC 11, only the circuit configuration of the reception system will be specifically described here.

The individual terminal PIC13 in the switch IC 11 is connected to the SAW filter SAW1 in the SAW duplexer SDP12. The unbalanced terminal of the SAW filter SAW1 is connected to the individual terminal PIC13 and the balanced terminal of the SAW filter SAW1 is connected to the first reception signal output port PrL1 of the high-frequency module 10E.

The individual terminal PIC14 in the switch IC 11 is connected to the SAW filter SAW2 in the SAW duplexer SDP12 and the SAW filter SAW3 in the SAW duplexer SDP34. The unbalanced terminal of the SAW filter SAW2 is connected to the individual terminal PIC14 and the balanced terminal of the SAW filter SAW2 is connected to the second reception signal output port PrL2 of the high-frequency module 10E.

The unbalanced terminal of the SAW filter SAW3 is connected to the individual terminal PIC14 and the balanced terminal of the SAW filter SAW3 is connected to the third reception signal output port PrH1 of the high-frequency module 10E. An individual terminal PIC17 in the switch IC 11 is connected to the SAW filter SAW4 in the SAW duplexer SDP34. The unbalanced terminal of the SAW filter SAW4 is connected to the individual terminal PIC17 and the balanced terminal of the SAW filter SAW4 is connected to the fourth reception signal output port PrH2 of the high-frequency module 10E. In other words, the unbalanced terminal of the SAW filter SAW2 in the SAW duplexer SDP12 and the unbalanced terminal of the SAW filter SAW3 in the SAW duplexer SDP34 are commonly used. Commonly using the unbalanced terminals of the SAW duplexers SDP12 and SDP34 in the above manner allows the high-frequency module 10E to be further reduced in size. In addition, it is also possible to improve the degree of freedom in the design of the wiring patterns, etc. of the multilayer body.

An inductor LA7 is connected between the individual terminal PIC14 and the SAW filter SAW2 and the SAW filter SAW2 side of the inductor LA7 is grounded via a capacitor CA7, defining an L-type low pass filter circuit including the inductor LA7 and the capacitor CA7.

A capacitor CA8 is connected between the individual terminal PIC14 and the SAW filter SAW3 and the SAW filter SAW3 side of the capacitor CA8 is grounded via an inductor LA8, defining an L-type high pass filter circuit including the capacitor CA8 and the inductor LA8.

Providing phase circuits including the low pass filter circuit and the high pass filter circuit and appropriately setting the element values of the inductors LA7 and LA8 and the capacitors CA7 and CA8 allows high isolation to be ensured between the transmission path at the SAW filter SAW2 side through which the GSM900 communication signal is transmitted and the transmission path at the SAW filter SAW3 side through which the GSM1800 communication signal is transmitted.

Figure 10:
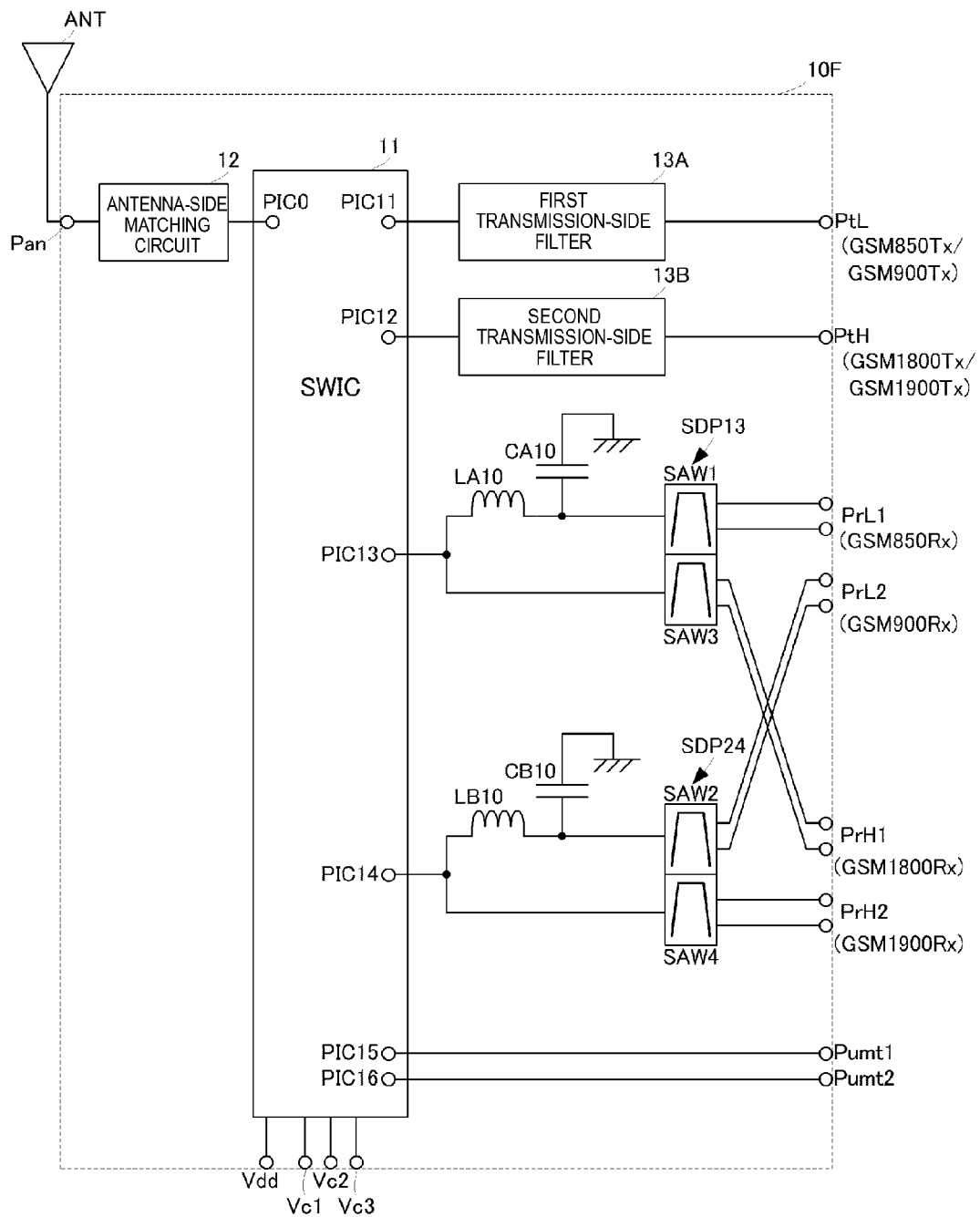
FIG. 10 is a diagram showing an example of the circuit configuration of a high-frequency module of a sixth preferred embodiment of the present invention.
Figure 11:
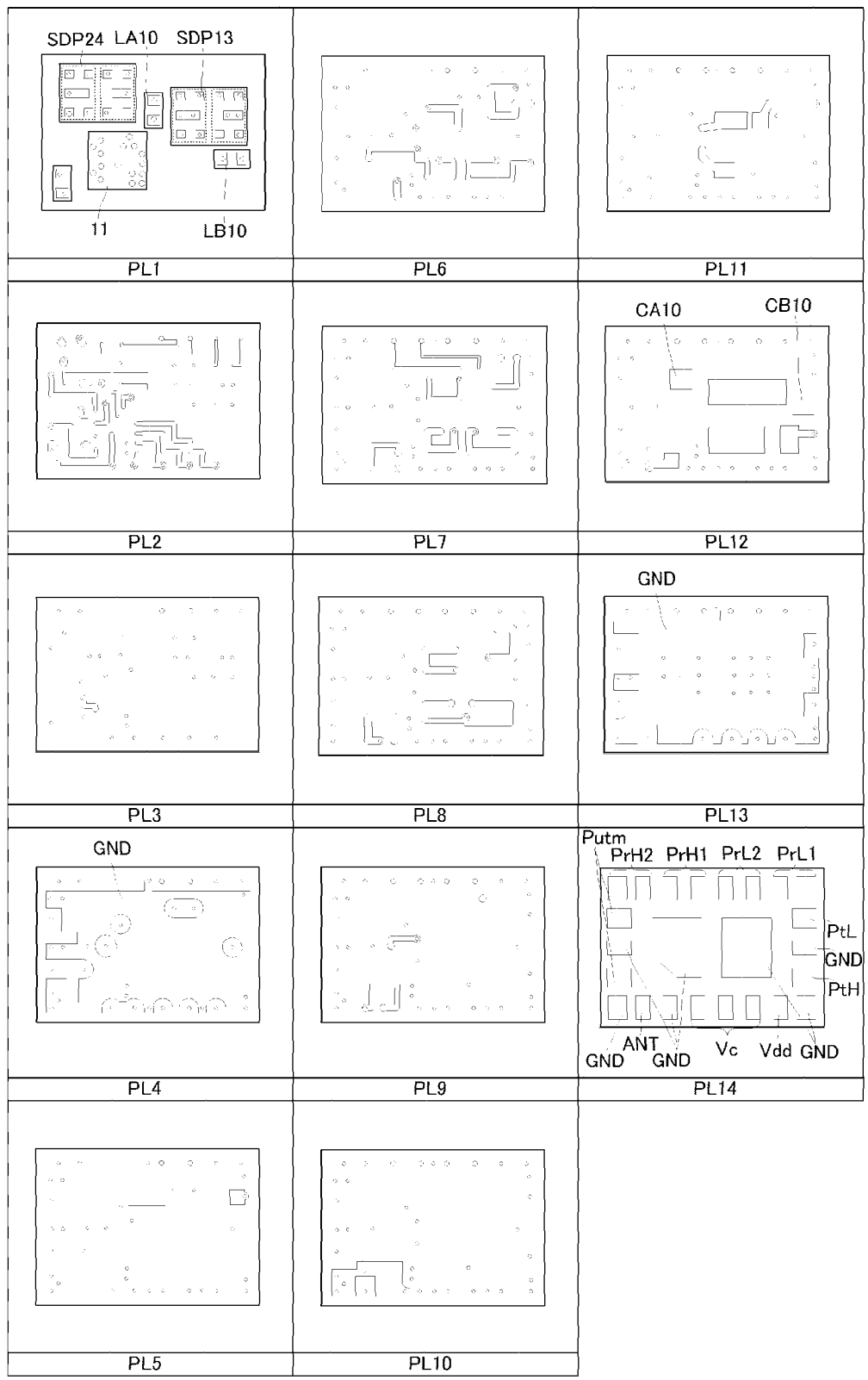
FIG. 11 is a layer diagram of the high-frequency module of the sixth preferred embodiment of the present invention.

A high-frequency module according to a sixth preferred embodiment will now be described with reference to FIGS. 10 and 11. FIG. 10 is a diagram showing an example of the circuit configuration of a high-frequency module 10F of the sixth preferred embodiment. Since the high-frequency module 10F of the present preferred embodiment basically differs from the high-frequency module 10A in the circuit configuration of the reception system of the switch IC 11, only the circuit configuration of the reception system will be specifically described here.

The individual terminal PIC13 in the switch IC 11 is connected to the SAW filters SAW1 and SAW3 in a SAW duplexer SDP13. The SAW duplexer SDP13 is a circuit element in which the SAW filters SAW1 and SAW3 are incorporated in a single casing.

The unbalanced terminal of the SAW filter SAW1 is connected to the individual terminal PIC13 and the balanced terminal of the SAW filter SAW1 is connected to the first reception signal output port PrL1 of the high-frequency module 10F. The unbalanced terminal of the SAW filter SAW3 is connected to the individual terminal PIC13 and the balanced terminal of the SAW filter SAW3 is connected to the third reception signal output port PrH1 of the high-frequency module 10F.

An inductor LA10 is connected between the individual terminal PIC13 and the SAW filter SAW1 and the SAW filter SAW1 side of the inductor LA10 is grounded via a capacitor CA10, defining an L-type low pass filter circuit including the inductor LA10 and the capacitor CA10.

Providing a phase circuit including the low pass filter circuit and appropriately setting the element values of the inductor LA10 and the capacitor CA10 allows high isolation to be ensured between the transmission path at the SAW filter SAW1 side through which the GSM850 communication signal is transmitted and the transmission path at the SAW filter SAW3 side through which the GSM1800 communication signal is transmitted. In other words, operational effects similar to those in the above preferred embodiments can be achieved even when the SAW filters SAW1 and SAW3 connected to the individual terminal PIC13 define the single SAW duplexer SDP13.

The individual terminal PIC14 in the switch IC 11 is connected to the SAW filters SAW2 and SAW4 in a SAW duplexer SDP24. The SAW duplexer SDP24 is a circuit element in which the SAW filters SAW2 and SAW4 are incorporated in a single casing.

The unbalanced terminal of the SAW filter SAW2 is connected to the individual terminal PIC14 and the balanced terminal of the SAW filter SAW2 is connected to the second reception signal output port PrL2 of the high-frequency module 10F. The unbalanced terminal of the SAW filter SAW4 is connected to the individual terminal PIC14 and the balanced terminal of the SAW filter SAW4 is connected to the fourth reception signal output port PrH2 of the high-frequency module 10F.

An inductor LB10 is connected between the individual terminal PIC14 and the SAW filter SAW2 and the SAW filter SAW2 side of the inductor LB10 is grounded via a capacitor CB10, defining an L-type low pass filter circuit including the inductor LB10 and the capacitor CB10.

Providing a phase circuit including the low pass filter circuit and appropriately setting the element values of the inductor LB10 and the capacitor CB10 allows high isolation to be ensured between the transmission path at the SAW filter SAW2 side through which the GSM900 communication signal is transmitted and the transmission path at the SAW filter SAW4 side through which the GSM1900 communication signal is transmitted. In other words, operational effects similar to those in the above preferred embodiments can be achieved even when the SAW filters SAW2 and SAW4 connected to the individual terminal PIC14 define the single SAW duplexer SDP24.

The high-frequency module 10F of the present preferred embodiment does not have the configuration in which the SAW filters having frequency bands that are close to each other as the pass bands are incorporated in a single casing, such as the configuration of the high-frequency module 10A of the first preferred embodiment described above, but has the configuration in which the SAW filters having frequency bands that are far from each other as the pass bands are incorporated in a single casing.

Even with the above configuration, it is possible to realize the high-frequency module including the multilayer body, as in the first preferred embodiment and the like. FIG. 11 is a layer diagram of the high-frequency module 10F of the present preferred embodiment. Since the layer structure of the high-frequency module 10F of the present preferred embodiment is substantially the same as the layer structure of the high-frequency module 10A of the first preferred embodiment, a detailed description of the layer structure of the high-frequency module 10F is omitted herein.

In the layer structure of the present preferred embodiment, the capacitor in the phase circuit provided between each individual terminal and the corresponding SAW duplexer is defined by an inner-layer electrode pattern in the multilayer body. The capacitor may be provided in the multilayer body on the basis of desired characteristics in the above manner. In this case, providing one opposing electrode on the layer close to the inner-layer ground electrode and using the inner-layer ground electrode as the other opposing electrode allows desired isolation to be more accurately achieved.

Figure 12:
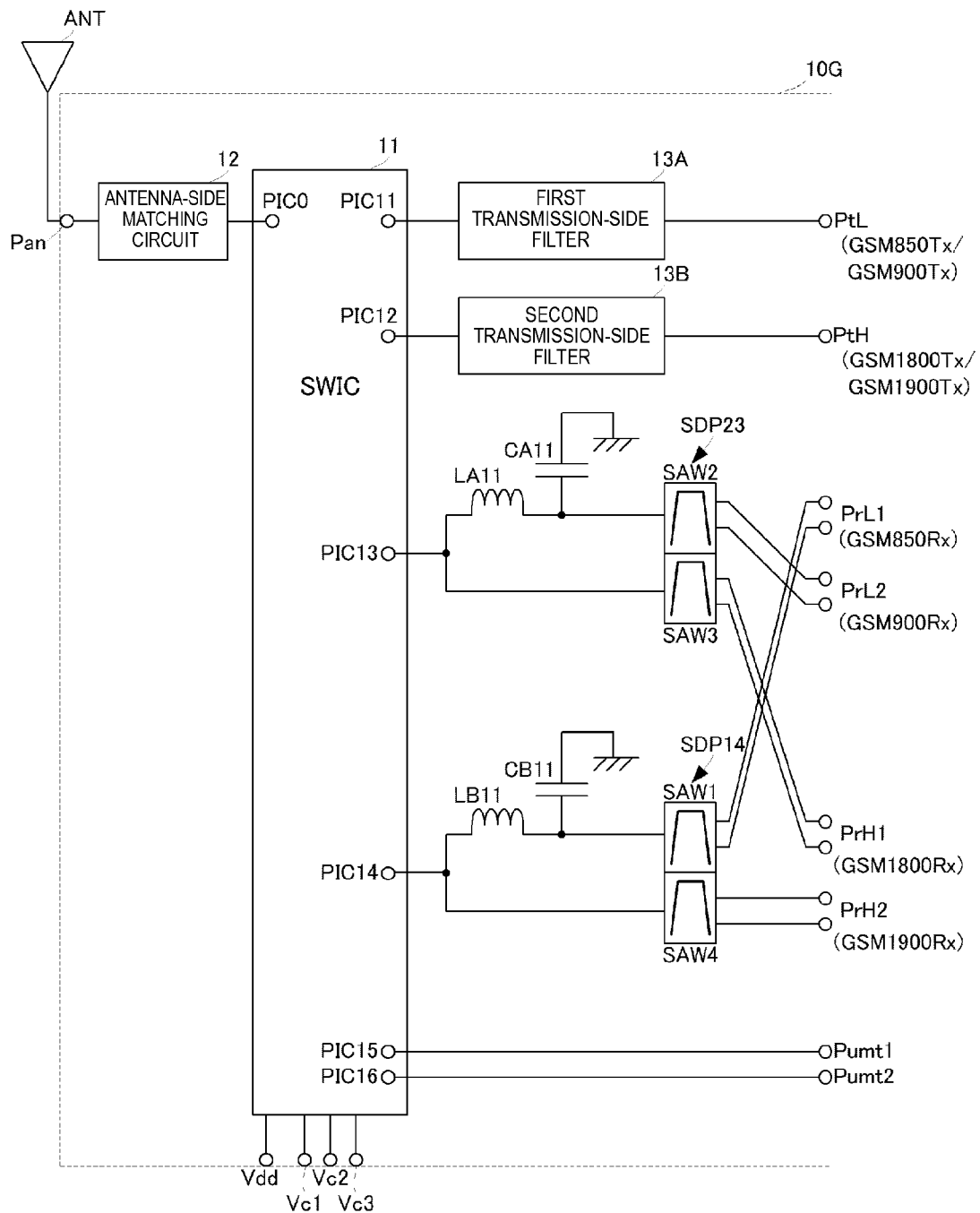
FIG. 12 is a diagram showing an example of the circuit configuration of a high-frequency module of a seventh preferred embodiment of the present invention.

A high-frequency module according to a seventh preferred embodiment will now be described with reference to FIG. 12. FIG. 12 is a diagram showing an example of the circuit configuration of a high-frequency module 10G of the seventh preferred embodiment. Since the high-frequency module 10G of the present preferred embodiment basically differs from the high-frequency module 10A in the circuit configuration of the reception system of the switch IC 11, as in the high-frequency module 10F, only the circuit configuration of the reception system will be specifically described here.

The individual terminal PIC13 in the switch IC 11 is connected to the SAW filters SAW2 and SAW3 in a SAW duplexer SDP23. The SAW duplexer SDP23 is a circuit element in which the SAW filters SAW2 and SAW3 are incorporated in a single casing.

The unbalanced terminal of the SAW filter SAW2 is connected to the individual terminal PIC13 and the balanced terminal of the SAW filter SAW2 is connected to the second reception signal output port PrL2 of the high-frequency module 10G. The unbalanced terminal of the SAW filter SAW3 is connected to the individual terminal PIC13 and the balanced terminal of the SAW filter SAW3 is connected to the third reception signal output port PrH1 of the high-frequency module 10G.

An inductor LA11 is connected between the individual terminal PIC13 and the SAW filter SAW2 and the SAW filter SAW2 side of the inductor LA11 is grounded via a capacitor CA11, defining an L-type low pass filter circuit including the inductor LA11 and the capacitor CA11.

Providing a phase circuit including the low pass filter circuit and appropriately setting the element values of the inductor LA11 and the capacitor CA11 allows high isolation to be ensured between the transmission path at the SAW filter SAW2 side through which the GSM900 communication signal is transmitted and the transmission path at the SAW filter SAW3 side through which the GSM1800 communication signal is transmitted. In other words, operational effects similar to those in the above preferred embodiments can be achieved even when the SAW filters SAW2 and SAW3 connected to the individual terminal PIC13 define the single SAW duplexer SDP23.

The individual terminal PIC14 in the switch IC 11 is connected to the SAW filters SAW1 and SAW4 in a SAW duplexer SDP14. The SAW duplexer SDP14 is a circuit element in which the SAW filters SAW1 and SAW4 are incorporated in a single casing.

The unbalanced terminal of the SAW filter SAW1 is connected to the individual terminal PIC14 and the balanced terminal of the SAW filter SAW1 is connected to the first reception signal output port PrL1 of the high-frequency module 10G. The unbalanced terminal of the SAW filter SAW4 is connected to the individual terminal PIC14 and the balanced terminal of the SAW filter SAW4 is connected to the fourth reception signal output port PrH2 of the high-frequency module 10G.

An inductor LB11 is connected between the individual terminal PIC14 and the SAW filter SAW1 and the SAW filter SAW1 side of the inductor LB11 is grounded via a capacitor CB11, defining an L-type low pass filter circuit including the inductor LB11 and the capacitor CB11.

Providing a phase circuit including the low pass filter circuit and appropriately setting the element values of the inductor LB11 and the capacitor CB11 allows high isolation to be ensured between the transmission path at the SAW filter SAW1 side through which the GSM850 communication signal is transmitted and the transmission path at the SAW filter SAW4 side through which the GSM1900 communication signal is transmitted. In other words, operational effects similar to those in the above preferred embodiments can be achieved even when the SAW filters SAW1 and SAW4 connected to the individual terminal PIC14 define the single SAW duplexer SDP14.

Figure 13:
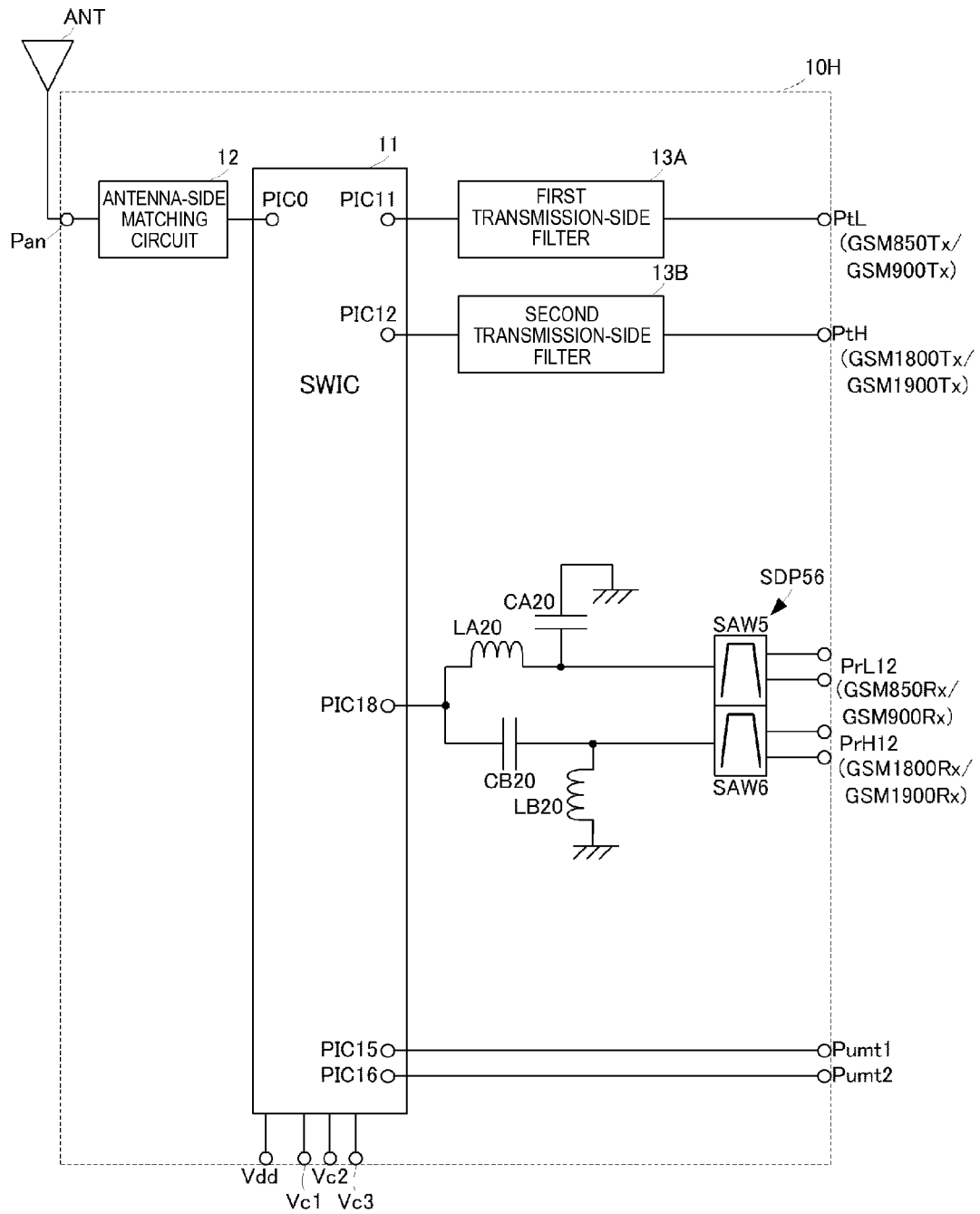
FIG. 13 is a diagram showing an example of the circuit configuration of a high-frequency module of an eighth preferred embodiment of the present invention.

A high-frequency module according to an eighth preferred embodiment will now be described with reference to FIG. 13. FIG. 13 is a diagram showing an example of the circuit configuration of a high-frequency module 10H of the eighth preferred embodiment. Since the high-frequency module 10H of the present preferred embodiment basically differs from the high-frequency module 10A in the circuit configuration of the reception system of the switch IC 11, only the circuit configuration of the reception system will be specifically described here.

An individual terminal PIC18 in the switch IC 11 is connected to SAW filters SAW5 and SAW6 in a SAW duplexer SDP56. The SAW duplexer SDP56 is a circuit element in which the SAW filters SAW5 and SAW6 are incorporated in a single casing.

The SAW filter SAW5 preferably is a SAW filter having the balanced-unbalanced transforming function and preferably is a filter using the frequency band including both the reception frequency band of the GSM850 communication signal and the reception frequency band of the GSM900 communication signal as the pass band. The unbalanced terminal of the SAW filter SAW5 is connected to the individual terminal PIC18 and the balanced terminal of the SAW filter SAW5 is connected to a fifth reception signal output port PrL12 of the high-frequency module 10H.

The SAW filter SAW6 preferably is a SAW filter having the balanced-unbalanced transforming function and is a filter using the frequency band including both the reception frequency band of the GSM1800 communication signal and the reception frequency band of the GSM1900 communication signal as the pass band. The unbalanced terminal of the SAW filter SAW6 is connected to the individual terminal PIC18 and the balanced terminal of the SAW filter SAW6 is connected to a sixth reception signal output port PrH12 of the high-frequency module 10H.

An inductor LA20 is connected between the individual terminal PIC18 and the SAW filter SAW5 and the SAW filter SAW5 side of the inductor LA20 is grounded via a capacitor CA20, defining an L-type low pass filter circuit including the inductor LA20 and the capacitor CA20.

A capacitor CB20 is connected between the individual terminal PIC18 and the SAW filter SAW6 and the SAW filter SAW6 side of the capacitor CB20 is grounded via an inductor LB20, defining an L-type high pass filter circuit including the capacitor CB20 and the inductor LB20.

Providing phase circuits including the low pass filter circuit and the high pass filter circuit and appropriately setting the element values of the inductors LA20 and LB20 and the capacitors CA20 and CB20 allows high isolation to be ensured between the transmission path at the SAW filter SAW5 side through which the GSM850 communication signal and the GSM900 communication signal are transmitted and the transmission path at the SAW filter SAW6 side through which the GSM1800 communication signal and the GSM1900 communication signal are transmitted.

With the configuration of the present preferred embodiment, it is possible to reduce the number of the individual terminals in the switch IC 11, the number of the SAW filters and the SAW duplexers, and the number of the external connection ports, thereby realizing the more compact high-frequency module.

Figure 14:
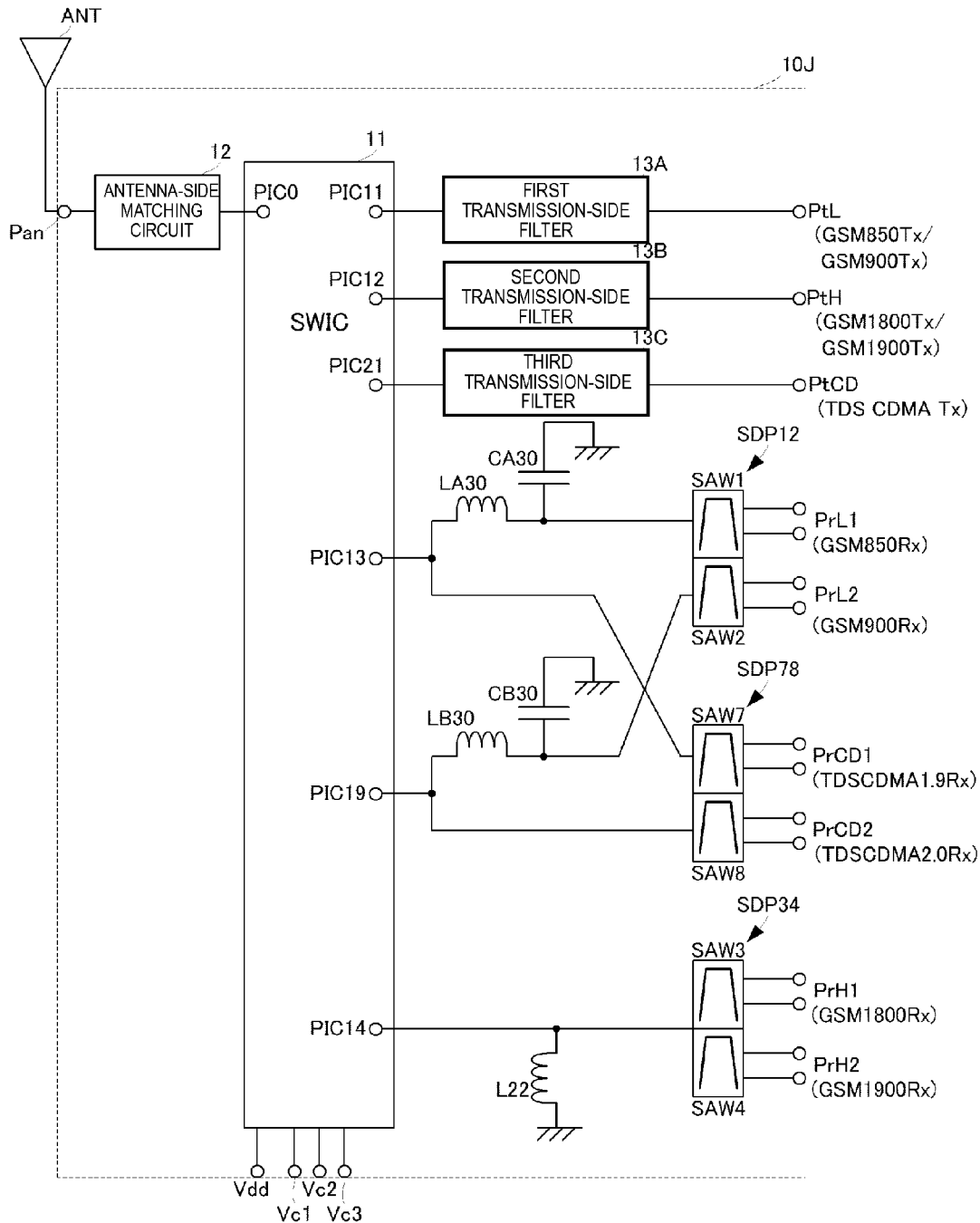
FIG. 14 is a diagram showing an example of the circuit configuration of a high-frequency module of a ninth preferred embodiment of the present invention.

A high-frequency module according to a ninth preferred embodiment will now be described with reference to FIG. 14. FIG. 14 is a diagram showing an example of the circuit configuration of a high-frequency module 10J of the ninth preferred embodiment. The high-frequency module 10J of the present preferred embodiment switches between two Time Division Synchronous Code Division Multiple Access (TDSCDMA) communication signals: a TDSCDMA1.9 communication signal (having a frequency within a 1.9-GHz band) and a TDSCDMA2.0 communication signal (having a frequency within a 2.0-GHz band), in addition to the GSM communication signals described in the above preferred embodiments, with the single antenna ANT to transmit and receive the communication signal after the switching. The high-frequency module 10J of the present preferred embodiment has the same basic configuration and concept as those of the high-frequency module 10A of the first preferred embodiment. Only points different from the high-frequency module 10A of the first preferred embodiment will be specifically described here.

An individual terminal PIC21 in the switch IC 11 is connected to a third transmission signal input port PtCD of the high-frequency module 10J via a third transmission-side filter 13C. A TDSCDMA1.9 transmission signal or a TDSCDMA2.0 transmission signal is input through the third transmission signal input port PtCD. The third transmission-side filter 13C has characteristics in that the transmission frequency bands of the TDSCDMA1.9 communication signal and the TDSCDMA2.0 communication signal are included in the pass band thereof and high-level harmonics including second harmonics and third harmonics of the TDSCDMA1.9 communication signal and the TDSCDMA2.0 communication signal are included in the attenuation band thereof.

The individual terminal PIC13 in the switch IC 11 is connected to the SAW filter SAW1 in the SAW duplexer SDP12 and a SAW filter SAW7 in a SAW duplexer SDP78.

The SAW filter SAW1 preferably is a SAW filter having the balanced-unbalanced transforming function and is a filter using the reception frequency band of the GSM850 communication signal as the pass band. The unbalanced terminal of the SAW filter SAW1 is connected to the individual terminal PIC13 and the balanced terminal of the SAW filter SAW1 is connected to the first reception signal output port PrL1 of the high-frequency module 10J.

The SAW filter SAW7 preferably is a SAW filter having the balanced-unbalanced transforming function and is a filter using the reception frequency band of the TDSCDMA1.9 communication signal as the pass band. The unbalanced terminal of the SAW filter SAW7 is connected to the individual terminal PIC13 and the balanced terminal of the SAW filter SAW7 is connected to a seventh reception signal output port PrCD1 of the high-frequency module 10J.

An inductor LA30 is connected between the individual terminal PIC13 and the SAW filter SAW1 and the SAW filter SAW1 side of the inductor LA30 is grounded via a capacitor CA30, defining an L-type low pass filter circuit including the inductor LA30 and the capacitor CA30. Providing a phase circuit including the low pass filter circuit and appropriately setting the element values of the inductor LA30 and the capacitor CA30 allows high isolation to be ensured between the transmission path at the SAW filter SAW1 side through which the GSM850 communication signal is transmitted and the transmission path at the SAW filter SAW7 side through which the TDSCDMA1.9 communication signal is transmitted.

An individual terminal PIC19 in the switch IC 11 is connected to the SAW filter SAW2 in the SAW duplexer SDP12 and a SAW filter SAW8 in the SAW duplexer SDP78.

The SAW filter SAW2 preferably is a SAW filter having the balanced-unbalanced transforming function and is a filter using the reception frequency band of the GSM900 communication signal as the pass band. The unbalanced terminal of the SAW filter SAW2 is connected to the individual terminal PIC19 and the balanced terminal of the SAW filter SAW2 is connected to the second reception signal output port PrL2 of the high-frequency module 10J.

The SAW filter SAW8 preferably is a SAW filter having the balanced-unbalanced transforming function and preferably is a filter using the reception frequency band of the TDSCDMA2.0 communication signal as the pass band. The unbalanced terminal of the SAW filter SAW8 is connected to the individual terminal PIC19 and the balanced terminal of the SAW filter SAW8 is connected to an eighth reception signal output port PrCD2 of the high-frequency module 10J.

An inductor LB30 is connected between the individual terminal PIC19 and the SAW filter SAW2 and the SAW filter SAW2 side of the inductor LB30 is grounded via a capacitor CB30, defining an L-type low pass filter circuit including the inductor LB30 and the capacitor CB30. Providing a phase circuit including the low pass filter circuit and appropriately setting the element values of the inductor LB30 and the capacitor CB30 allows high isolation to be ensured between the transmission path at the SAW filter SAW2 side through which the GSM900 communication signal is transmitted and the transmission path at the SAW filter SAW8 side through which the TDSCDMA2.0 communication signal is transmitted.

The individual terminal PIC14 in the switch IC 11 is connected to the SAW filters SAW3 and SAW4 in the SAW duplexer SDP34. The SAW filter SAW3 preferably is a SAW filter having the balanced-unbalanced transforming function and is a filter using the reception frequency band of the GSM1800 communication signal as the pass band. The unbalanced terminal of the SAW filter SAW3 is connected to the individual terminal PIC14 and the balanced terminal of the SAW filter SAW3 is connected to the third reception signal output port PrH1 of the high-frequency module 10J. The SAW filter SAW4 preferably is a SAW filter having the balanced-unbalanced transforming function and preferably is a filter using the reception frequency band of the GSM1900 communication signal as the pass band. The unbalanced terminal of the SAW filter SAW4 is connected to the individual terminal PIC14 and the balanced terminal of the SAW filter SAW4 is connected to the fourth reception signal output port PrH2 of the high-frequency module 10J.

A terminal common to the SAW filters SAW3 and SAW4 is provided at the unbalanced terminal side of the SAW duplexer SDP34. The transmission path between the common terminal of the SAW duplexer SDP34 and the individual terminal PIC14 is grounded at a certain position with an inductor L22.

Also with the above configuration, it is possible to realize the compact high-frequency module with low loss.

The high-frequency modules described in the above preferred embodiments indicate only examples embodying the features of the present invention. Any of the above configurations is applicable to a high-frequency module that transmits and receives three or more communication signals at least including two communication signals whose frequencies are close to each other and a communication signal having a frequency that is far from the frequencies of the two communication signals by a certain frequency or more with a common antenna by using a switch IC and filters. Although the examples preferably using the SAW filters in the reception system circuit are described above, other filter circuits may be used.

Specific concepts of the communication signals whose frequencies are close to each other and the communication signals whose frequencies are far from each other are not accurately described in the above description. For example, the communication signals whose frequencies are close to each other may be communication signals whose frequency bands are partially overlapped in the transmission band and the reception band or communication signals whose frequency bands are in the same order (for example, 100-MHz order). The communication signals whose frequencies are far from each other may be communication signals whose frequency bands are spaced apart from each other by a certain frequency or more or communication signals whose frequency bands are in different orders (for example, 100-MHz order and 1-GHz order). When three communication signals having different frequency bands exist, two communication signals having relatively close frequency bands may be set as the communication signals whose frequencies are close to each other and the remaining communication signal whose frequency band is relatively far from the frequency bands of the other two communication signals may be set as the communication signal whose frequency is far from those of the other communication signals.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
    a switch IC including a common terminal and a plurality of individual terminals; and
    a plurality of filters connected to the individual terminals in the switch IC, for which a pass band is set for each communication signal; wherein
    the plurality of filters at least include a first filter having a frequency of a first communication signal as the pass band, a second filter having a frequency of a second communication signal as the pass band, the frequency band of the first communication signal being close to the frequency band of the second communication signal, and a third filter having a frequency of a third communication signal as the pass band, the frequency of the third communication signal being far from the frequencies of the first communication signal and the second communication signal;
    the first filter and the third filter are connected to a first individual terminal in the switch IC; and
    the second filter is connected to a second individual terminal in the switch IC.

2. The high-frequency module according to claim 1, wherein, when a plurality of communication signals corresponding to the third communication signal exist, a communication signal whose phase variation within the frequency band is small and which has larger reflection strength for the first filter is set to the third communication signal.

3. The high-frequency module according to claim 1, wherein the frequency of the first communication signal is lower than the frequency of the third communication signal, and a low-pass-filter phase circuit is provided at least one of between the first filter and the first individual terminal and between the second filter and the second individual terminal.

4. The high-frequency module according to claim 1, further comprising a fourth filter having a frequency of a fourth communication signal whose frequency is close to the frequency of the third communication signal as the pass band, wherein the fourth filter is connected to the second individual terminal in the switch IC.

5. The high-frequency module according to claim 1, further comprising a fourth filter having a frequency of a fourth communication signal whose frequency is close to the frequency of the third communication signal as the pass band, wherein the fourth filter is connected to a third individual terminal in the switch IC.

6. The high-frequency module according to claim 5, wherein the frequencies of the first communication signal and the second communication signal are lower than the frequency of the fourth communication signal, and a high-pass-filter phase circuit is provided at least one of between the third filter and the first individual terminal and between the fourth filter and the individual terminal connected to the fourth filter.

7. The high-frequency module according to claim 5, wherein the first filter, the second filter, the third filter, and the fourth filter are mounted filters mounted in a multilayer body including dielectric layers, and the first filter is mounted so as to be close to the third filter, the second filter is mounted so as to be close to the fourth filter, or the first filter is mounted so as to be close to the third filter and the second filter is mounted so as to be close to the fourth filter.

8. The high-frequency module according to claim 7, wherein the first filter and the third filter define a package duplexer, the second filter and the fourth filter define a package duplexer, or the first filter and the third filter define a package duplexer and the second filter and the fourth filter define a package duplexer.

* * * * *